US012707571B2

(12) United States Patent
You et al.

(10) Patent No.: US 12,707,571 B2
(45) Date of Patent: Aug. 11, 2026

(54) CIRCUIT BOARD

(71) Applicant: LG INNOTEK CO., LTD., Seoul (KR)

(72) Inventors: Chae Young You, Seoul (KR); Soo Min Lee, Seoul (KR); Jae Hun Jeong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 228 days.

(21) Appl. No.: 18/723,616

(22) PCT Filed: Dec. 23, 2022

(86) PCT No.: PCT/KR2022/021233
§ 371 (c)(1),
(2) Date: Jun. 24, 2024

(87) PCT Pub. No.: WO2023/121406
PCT Pub. Date: Jun. 29, 2023

(65) Prior Publication Data

US 2024/0407103 A1 Dec. 5, 2024

(30) Foreign Application Priority Data

Dec. 23, 2021 (KR) ........................ 10-2021-0186539

(51) Int. Cl.
*H05K 1/00* (2006.01)
*H05K 1/11* (2006.01)
(Continued)

(52) U.S. Cl.
CPC ............ *H05K 1/183* (2013.01); *H05K 1/115* (2013.01); *H10W 70/68* (2026.01);
(Continued)

(58) Field of Classification Search
CPC ...... H05K 3/4697; H05K 1/185; H05K 1/115; H05K 1/183; H05K 1/111; H05K 1/18;
(Continued)

(56) References Cited

U.S. PATENT DOCUMENTS 6,433,303 B1 8/2002 Liu et al.
6,452,132 B1 9/2002 Fuse
(Continued)

FOREIGN PATENT DOCUMENTS

JP 2008-251623 A 10/2008
KR 10-2001-0049570 A 6/2001
(Continued)

OTHER PUBLICATIONS

International Search Report dated Apr. 3, 2023 in International Application No. PCT/KR2022/021233.
(Continued)

*Primary Examiner* — Pete T Lee
(74) *Attorney, Agent, or Firm* — SALIWANCHIK, LLOYD & EISENSCHENK

(57) ABSTRACT

A circuit board according to an embodiment includes a first insulating layer; and a second insulating layer disposed on the first insulating layer and including a cavity; wherein the second insulating layer includes a lower surface of the cavity positioned higher than an upper surface of the first insulating layer, wherein the lower surface of the cavity includes: a plurality of first portions, and a plurality of second portions provided between the plurality of first portions and having a height different from that of the plurality of first portions, and wherein a height difference between a portion having a highest height and a portion having a lowest height of the plurality of first portions is 1 μm or less.

20 Claims, 12 Drawing Sheets

(51) Int. Cl.
*H05K 1/183* (2026.01)
*H10W 70/68* (2026.01)
*H10W 70/685* (2026.01)
*H10W 90/00* (2026.01)

(52) U.S. Cl.
CPC . *H05K 2201/09481* (2013.01); *H10W 70/682* (2026.01); *H10W 70/685* (2026.01); *H10W 90/724* (2026.01)

(58) Field of Classification Search
CPC ........ H05K 1/11; H05K 1/186; H05K 1/0298; H05K 3/0017; H05K 3/4644; H05K 1/113; H05K 1/0296; H05K 1/0366; H05K 2201/096; H05K 3/0032; H05K 1/036; H05K 1/112; H05K 2201/09036; H05K 2201/10515; H05K 2201/10734; H05K 2203/025; H05K 3/284; H05K 3/4007; H05K 3/46; H05K 1/02; H05K 1/03; H05K 2201/09481; H05K 2201/09827; H05K 2201/10015; H05K 2201/10492; H05K 2201/10674; H05K 3/0011; H05K 3/0026; H05K 3/28; H05K 3/4602; H05K 1/0271; H05K 1/119; H05K 1/181; H05K 2201/0141; H05K 2201/0209; H05K 2201/09136; H05K 2201/10159; H05K 2201/10462; H05K 2203/308; H05K 3/0023; H05K 3/0041; H05K 3/181; H05K 3/4038; H05K 3/4623; H05K 3/4682; H05K 1/0203; H05K 1/0306; H05K 1/09; H05K 2201/0195; H05K 2201/09509; H05K 2201/09563; H05K 2201/09854; H05K 2203/0384; H05K 3/10; H05K 3/107; H05K 3/244; H05K 3/287; H05K 3/321; H05K 3/328; H05K 3/34; H05K 1/0206; H05K 1/0209; H05K 1/025; H05K 1/0256; H05K 1/0284; H05K 1/142; H05K 1/144; H05K 1/16; H05K 1/182; H05K 2201/042; H05K 2201/048; H05K 2201/09445; H05K 2201/09472; H05K 2201/09781; H05K 2201/09918; H05K 2201/10022; H05K 2201/10098; H05K 2201/2081; H05K 2203/0323; H05K 2203/061; H05K 2203/107; H05K 3/00; H05K 3/0014; H05K 3/0044; H05K 3/0055; H05K 3/0091; H05K 3/064; H05K 3/30; H05K 3/301; H05K 3/323; H05K 3/429; H05K 3/4605; H05K 3/4608; H05K 3/4661; H05K 3/4694; H10W 70/60; H10W 70/685; H10W 70/68; H10W 70/05; H10W 90/701; H10W 70/614; H10W 90/00; H10W 70/611; H10W 70/635; H10W 70/65; H10W 72/884; H10W 74/00; H10W 90/722; H10W 90/724; H10W 90/754; H10W 70/095; H10W 70/682; H10W 72/20; H10W 74/15; H10W 90/732; H10W 90/734; H10W 72/072; H10W 90/401; H10W 42/121; H10W 42/20; H10W 72/075; H10W 72/241; H10W 72/252; H10W 72/952; H10W 74/01; H10W 74/117; H10W 90/29
See application file for complete search history.

(56) References Cited

U.S. PATENT DOCUMENTS

| | | | | |
|---|---|---|---|---|
| 10,916,495 | B2 | 2/2021 | Choi et al. | |
| 11,640,952 | B2 | 5/2023 | Hwang et al. | |
| 2011/0215349 | A1 | 9/2011 | An et al. | |
| 2013/0153266 | A1* | 6/2013 | Hyun | H05K 1/0216 174/250 |
| 2015/0021084 | A1* | 1/2015 | Ko | H05K 1/09 174/262 |
| 2016/0174364 | A1* | 6/2016 | Harkness, Jr. | H05K 1/115 174/262 |
| 2022/0262713 | A1 | 8/2022 | Na et al. | |

FOREIGN PATENT DOCUMENTS

| | | | |
|---|---|---|---|
| KR | 10-2001-0095011 | A | 11/2001 |
| KR | 10-1039994 | B1 | 6/2011 |
| KR | 10-2016-0150244 | A | 12/2016 |
| KR | 10-2017-0067472 | A | 6/2017 |
| KR | 10-1922884 | B1 | 11/2018 |
| KR | 10-2021-0000105 | A | 1/2021 |
| KR | 10-2021-0079034 | A | 6/2021 |

OTHER PUBLICATIONS

Office Action dated Oct. 14, 2025 in Korean Application No. 10-2021-0186539.

* cited by examiner (a)

(b)

(a)

(b)

(a)

(b)

CIRCUIT BOARD

CROSS-REFERENCE TO RELATED APPLICATIONS

This application is the U.S. national stage application of International Patent Application No. PCT/KR2022/021233, filed Dec. 23, 2022, which claims the benefit under 35 U.S.C. § 119 of Korean Application No. 10-2021-0186539, filed Dec. 23, 2021, the disclosures of each of which are incorporated herein by reference in their entirety.

TECHNICAL FIELD

The embodiment relates to a circuit board and a semiconductor package including the same.

BACKGROUND ART

Recently, efforts have been made to develop improved 5G (5th generation) communication systems or pre-5G communication systems to meet the demand for wireless data traffic.

The 5G communication system uses ultra-high frequency (mm-Wave) bands (sub 6 GHz, 28 GHz, 38 GHz or higher frequencies) to achieve high data transfer rates. This high frequency band is called mm-Wave due to the length of the wavelength.

In order to alleviate the path loss of radio waves in the ultra-high frequency band and increase the transmission distance of radio waves, integration technologies such as beamforming, massive MIMO, and array antenna are being developed in 5G communication systems.

Considering that these frequency bands can consist of hundreds of active antennas of wavelengths, antenna systems can be relatively large.

This means that a plurality of boards that make up an active antenna system, that is, an antenna board, an antenna feed board, a transceiver board, a and baseband board, must be integrated into one compact unit.

Accordingly, the circuit board applied to the conventional 5G communication system has a structure in which a plurality of boards as described above are integrated, and thus has a relatively thick thickness. Accordingly, in a prior art, an overall thickness of the circuit board was reduced by thinning a thickness of an insulating layer constituting the circuit board.

However, there are limitations in manufacturing a circuit board by reducing the thickness of the insulating layer, and furthermore, as the thickness of the insulating layer becomes thinner, there is a problem in that the circuit pattern is not stably protected.

Accordingly, recently, an overall thickness of a device has been reduced by forming a cavity in a circuit board using a laser or sand blast and mounting the device in the formed cavity.

A general cavity formation process essentially includes a de-smear process for removing debris from a sidewall of the cavity after forming the cavity using a laser or sandblast.

However, when the de-smear process is performed as described above, a size of the cavity is expanded as part of the side wall of the cavity is removed, and this causes a problem in that the size of the cavity becomes larger than a target size.

In addition, when the size of the cavity becomes larger than the target size, a dead region, which is a region where a circuit pattern cannot be disposed, increase, and accordingly, there is a problem that the degree of circuit integration decreases or a width in a horizontal direction or a thickness in a vertical direction of the circuit board increases.

DISCLOSURE

Technical Problem

An embodiment provides a circuit board capable of inhibiting a size of a cavity from expanding and a semiconductor package including the same.

In addition, the embodiment provides a circuit board capable of improving an inclination angle of a sidewall of a cavity and reducing a width of a dead region, and a semiconductor package including the same.

In addition, the embodiment provides a circuit board capable of improving circuit integration and a semiconductor package including the same.

In addition, the embodiment provides a circuit board capable of reducing a roughness of a lower surface of the cavity and a semiconductor package including the same.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

A circuit board according to an embodiment comprises a first insulating layer; and a second insulating layer disposed on the first insulating layer and including a cavity; wherein the second insulating layer includes a lower surface of the cavity positioned higher than an upper surface of the first insulating layer, wherein the lower surface of the cavity includes: a plurality of first portions, and a plurality of second portions provided between the plurality of first portions and having a height different from that of the plurality of first portions, and wherein a height difference between a portion having a highest height and a portion having a lowest height of the plurality of first portions is 1 μm or less.

In addition, the plurality of second portions protrude upwardly between the plurality of first portions.

In addition, a plane of each of the plurality of first portions has a square shape.

In addition, each of the plurality of second portions is provided along a circumferential direction of the plurality of first portions and has a circumferential shape of each of the plurality of first portions.

In addition, the circuit board further comprises a first circuit pattern layer disposed on an upper surface of the first insulating layer and including a pad vertically overlapping the cavity; and wherein the first portion and second portion of the lower surface of the cavity are positioned lower than an upper surface of the pad.

In addition, a height of the first portion of the lower surface of the cavity satisfies a range of 5% to 70% of a height of the pad.

In addition, a height of the second portion of the lower surface of the cavity satisfies a range of 10% to 80% of a height of the pad.

In addition, a height of the second portion of the lower surface of the cavity satisfies a range of 1.2 um to 5 um.

In addition, the plurality of second portions are depressed toward an upper surface of the first insulating layer between the plurality of first portions, and wherein a lowermost end of each of the plurality of second portions is positioned higher than the upper surface of the first insulating layer.

In addition, an inclination angle between the first portion and a side wall of the cavity satisfies a range of 91 degrees to 110 degrees.

In addition, the sidewall of the cavity has a curvature.

In addition, the inclination angle of the sidewall of the cavity is an inclination angle of a virtual straight line connecting a first end of the sidewall of the cavity adjacent to an upper surface of the second insulating layer and a second end of the sidewall of the cavity adjacent to a lower surface of the second insulating layer.

In addition, the sidewall of the cavity includes a first end adjacent to the upper surface of the second insulating layer and a second end horizontally overlapping the pad, and a horizontal distance between the first end at one side of the cavity and the second end at the one side of the cavity satisfies a range of 5 μm to 60 μm.

In addition, a planar area occupied by the first portion in a total planar area of the lower surface of the cavity satisfies a range of 70% to 95%, and a planar area occupied by the second portion in the total planar area of the lower surface of the cavity satisfies a range of 5% to 30%.

In addition, a planar shape of the lower surface of the cavity has a waffle shape.

In addition, the circuit board further comprises a protective layer disposed on the upper surface of the second insulating layer and including an open portion vertically overlapping the cavity, and a width of the open portion of the protective layer corresponds to the width of the cavity.

In addition, a width of a region of the cavity adjacent to a lower surface of the protective layer in a thickness direction of the cavity is the same as a width of the region of the open portion adjacent to the upper surface of the second insulating layer in the thickness direction of the open portion.

In addition, the sidewall of the open portion of the protective layer above has a curvature, and an inclination angle of a sidewall of the open portion of the protective layer corresponds to the inclination angle of the sidewall of the cavity.

In addition, a horizontal distance between one end of the sidewall of the open portion adjacent to the upper surface of the protective layer and the other end of the sidewall of the open portion adjacent to the lower surface of the protective layer satisfies a range of 5 μm to 60 μm.

Meanwhile, the package substrate according to the embodiment comprises a first insulating layer; a second insulating layer disposed on an upper surface of the first insulating layer; a first circuit pattern layer disposed on the upper surface of the first insulating layer and containing a pad vertically overlapping the cavity; a connection part disposed on the pad of the first circuit pattern layer; and a device mounted on the connection part, wherein the cavity includes a lower surface positioned higher than the upper surface of the first insulating layer, the lower surface of the cavity includes a plurality of first portions and a plurality of second portions disposed between the plurality of first portions, and the plurality of first portions are a flat part where a height difference between a portion with a highest height and a portion with a lowest height is less than 1 μm, and the plurality of second portions, and wherein the plurality of second portions protrude in an upward direction or are recessed in a downward direction between the plurality of first portions while having a height difference from that of the plurality of first portions.

Advantageous Effects

An embodiment forms a cavity in a circuit board using a laser beam of a top-hat distribution. Accordingly, the embodiment may reduce a roughness of a lower surface compared to a cavity formed by a laser beam of a gaussian distribution. Accordingly, an embodiment may improve the physical reliability of the cavity, thereby improving the mountability of the device.

Specifically, the lower surface of the cavity in the embodiment includes a plurality of first portions and a second portion between the plurality of first portions. In this case, the first portion is a flat portion having a substantially uniform height. In addition, the second portion is a portion protruding with a certain height between the first portions. In this case, the first portion in the embodiment may be formed flat, unlike the comparative example. For example, in a comparative example, a cavity is formed by a Gaussian-distributed laser beam, whereby the first portion of the lower surface of the cavity has a concave shape in a downward direction. Accordingly, a surface roughness in the first portion (which means that a height difference for each location of the first portion is large), and thus the reliability of the cavity may be deteriorated. Here, deteriorating the reliability of the cavity may mean that the mountability of the device mounted in the cavity is deteriorated.

On the other hand, the embodiment forms a cavity by providing a laser beam with a uniform power energy distribution using a laser beam having a top-hat distribution, so that the first portion may have a substantially flat lower surface. Accordingly, the embodiment may improve the mountability of the device mounted in the cavity, and further improve the product reliability of a circuit board.

In addition, the embodiment forms a cavity using a laser beam of a Top-hat distribution, and may omit a configuration such as a laser stop layer or a laser mask used to form the cavity. Accordingly, the embodiment can omit a process of forming and removing the stop layer and the laser mask, thereby improving product processability. Accordingly, the embodiment can lower the product price and further improve product yield.

In addition, in the embodiment, an inclination angle of the cavity may be formed close to 90 degrees without a laser mask by forming a cavity using a laser beam of a top-hat distribution. Accordingly, the embodiment may minimize a difference between an upper width and a lower width of the cavity, thereby minimizing an area of a dead region. In addition, the embodiment may improve circuit integration by minimizing the area of the dead region, and further reduce an overall volume of the circuit board.

In addition, the embodiment proceeds with a process of forming the cavity after forming the open portion in the protective layer. This may be because a cavity having an improved inclination angle may be formed without a laser mask by using a laser beam of a Top-hat distribution. Accordingly, the embodiment may allow a width of the open portion and a width of the cavity to have substantially the same width by forming the cavity after forming the open portion in the protective layer. This is due to the fact that the open portion is formed before the cavity and does not need to consider a process deviation for forming the open portion, and forms a part of the open portion in a process of forming the cavity. Accordingly, the embodiment may minimize the dead region by having substantially the same width between the open portion and the cavity, thereby improving circuit integration and reducing the volume of the circuit board.

MODES OF THE INVENTION

Hereinafter, embodiments of the present invention will be described in detail with reference to the accompanying drawings.

However, the spirit and scope of the embodiment is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (a), and (b) may be used. These terms are only used to distinguish the elements from other elements, and the terms are not limited to the essence, order, or order of the elements. In addition, when an element is described as being "connected", or "coupled" to another element, it may include not only when the element is directly "connected" to, or "coupled" to other elements, but also when the element is "connected", or "coupled" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements. Furthermore, when expressed as "on (over)" or "under (below)", it may include not only the upper direction but also the lower direction based on one element.

Before describing embodiments of the present invention, a circuit board according to a comparative example will be described.

Figure 1:
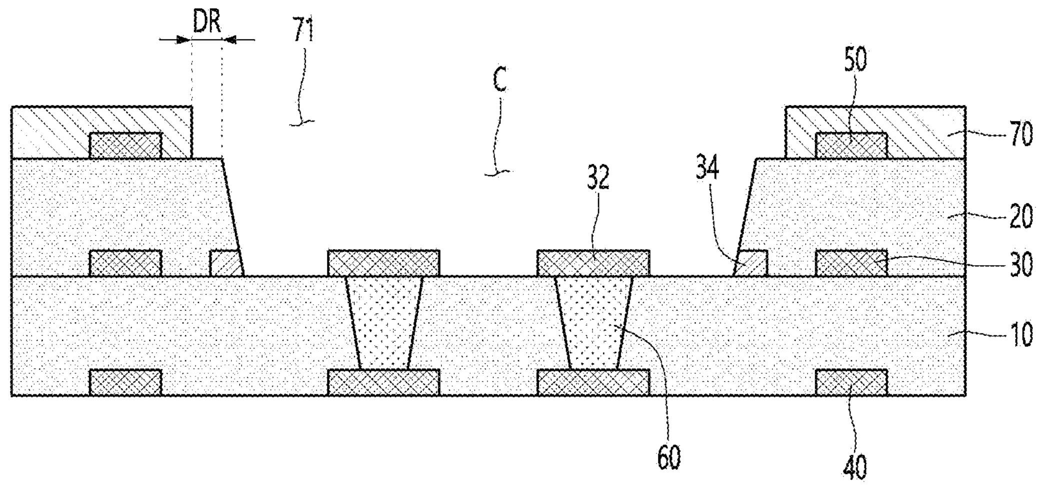
FIG. 1 is a cross-sectional view of a circuit board of a first comparative example.
Figure 2:
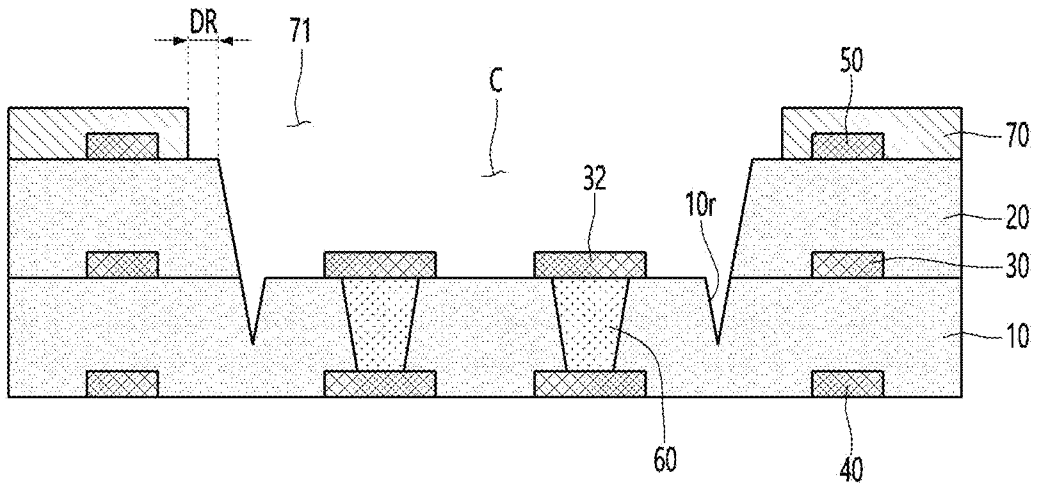
FIG. 2 is a cross-sectional view of a circuit board of a second comparative example.

FIG. 1 is a cross-sectional view of a circuit board of a first comparative example, and FIG. 2 is a cross-sectional view of a circuit board of a second comparative example.

Referring to FIG. 1, a circuit board according to a first comparative example includes a cavity (C).

The circuit board according to the first comparative example includes a cavity C having a structure that passes through at least one insulating layer among a plurality of insulating layers.

Specifically, an insulating layer of the circuit board of the first comparative example includes a first insulating layer 10 and a second insulating layer 20 disposed on the first insulating layer 10.

And, the cavity C is formed to pass through the second insulating layer 20. In addition, the circuit board includes a circuit pattern layer disposed on the surface of the insulating layer.

For example, the circuit board includes a first circuit pattern layer 30 disposed on an upper surface of the first insulating layer 10. In addition, the circuit board includes a second circuit pattern layer 40 disposed on a lower surface of the first insulating layer 10. In addition, the circuit board includes a third circuit pattern layer 50 disposed on the second insulating layer 20.

In addition, the circuit board includes a through electrode 60 that passes through the first insulating layer 10. The through electrode 60 electrically connects the first circuit pattern layer 30 disposed on the upper surface of the first insulating layer 10 and the second circuit pattern layer 40 disposed on the lower surface of the first insulating layer 10.

The upper surface of the first insulating layer 10 includes a first region vertically overlapping the cavity (C) and a second region excluding the first region. In this case, the first region of the first insulating layer 10 described below can be said to be an first upper surface of the first insulating layer 10, and the second region of the first insulating layer 10 can be said to be a second upper surface of the first insulating layer 10.

In addition, the first circuit pattern layer 30 may be disposed in the first region and the second region of the upper surface of the first insulating layer 10, respectively. At this time, in the first comparative example, a cavity C passing through the second insulating layer 20 may be formed using a stop layer (not shown).

Accordingly, the first circuit pattern layer 30 includes a pad portion 32 disposed in a first region of the upper surface of the first insulating layer 10, and a stop pattern 34 disposed in a second region of the upper surface of the first insulating layer 10. The stop pattern 34 may be disposed at a boundary region between the first region and the second region on the upper surface of the first insulating layer 10. For example, the stop pattern 34 is disposed in the second region of the upper surface of the first insulating layer 10, and a side surface of the stop pattern may form a part of a sidewall of the cavity C. For example, the cavity C of the first comparative example may include a first sidewall including the second insulating layer 20 and a second sidewall including the stop pattern 34.

In this case, in the first comparative example, the stop pattern 34 is disposed on the upper surface of the first insulating layer 10, surrounding the boundary region between the first region and the second region.

Accordingly, the first comparative example includes a process of forming a stop layer to form the cavity (C) and a process of forming the stop pattern 34 by removing the stop layer, and there is a problem in that the manufacturing process becomes complicated as a result. In addition, in the first comparative example, there is a problem that a portion of the pad portion 32 of the first circuit pattern layer 30 is also etched during the etching process for removing the stop layer. As a result, there is a problem in that the pad portion 32 is deformed. In addition, in the first comparative example, if the pad portion 32 is deformed, a reliability problem may occur in which a connection part such as a solder ball is not stably seated on the pad portion 32.

In addition, in the first comparative example, the pad portion 32 has a problem in that it cannot be directly connected to other pattern portions of the first circuit pattern layer 30 disposed in the second region of the upper surface of the first insulating layer 10. For example, in the first comparative example, the stop pattern 34 is disposed in the boundary region corresponding to the cavity C. Accordingly, if there is a trace connecting the pad portion 32 and the other pattern portions, the trace comes into electrical contact with the stop pattern 34, which may cause electrical reliability problems. For example, in the first comparison example, when there are at least two traces, a problem may occur in which the traces are electrically connected to each other by the stop pattern 34, and accordingly, a short circuit problem may occur as pad portions that should be electrically separated from each other are electrically connected to each other by the stop pattern 34.

Accordingly, in the first comparative example, the pad portion 32 and the pattern portion 36 are not directly connected to each other through traces, but are connected through the through electrode 60. Therefore, the first comparative example does not have a structure in which the pad portion 32 and the pattern portion 36 are directly connected to each other on the upper surface of the first insulating layer 10, and there is a problem that the length of the signal transmission line between them becomes longer, and as the length of the signal transmission line becomes longer, there is a problem that signal transmission loss increases due to vulnerability to noise.

Furthermore, in the first comparative example, in an etching process of removing the stop layer, all of the stop layers may not be removed. In addition, when all of the stop layers are not removed, there is a short circuit problem in which a plurality of pad portions 32 are electrically connected by the stop layer.

Meanwhile, the circuit board of the first comparative example includes a protective layer 70 disposed on the second insulating layer 20. The protective layer 70 includes an open portion 71 vertically overlapping the cavity C. The open portion 71 of the protective layer 70 vertically overlaps the cavity C. In this case, a width of the open portion 71 of the protective layer 70 is greater than a width of the cavity C. This is because a time point at which the open portion 71 of the protective layer 70 is formed is later than the time point at which the cavity C is formed.

Specifically, in the first comparative example, after the cavity C is formed in the second insulating layer 20, a protective layer 70 is formed on the second insulating layer 20 and a process of forming the open portion 71 is performed. In this case, when the width of the open portion 71 is smaller than the width of the cavity C, there is a problem that a chip (not shown) cannot be normally mounted in the cavity C. Accordingly, in the first comparative example, the open portion 71 is formed to have a width greater than that of the cavity C in consideration of a process deviation in a process of forming the open portion 71. Accordingly, in the first comparative example, a dead region DR corresponding to a horizontal region between the sidewalls of the cavity C is present from the sidewall of the open portion 71. In addition, the dead region DR has a problem of increasing an overall size of the circuit board.

In addition, in the case of forming the cavity C after forming the protective layer 70 in the first comparative example, there is a problem that the laser mask used to form the cavity C cannot be disposed on the second insulating layer 20. Accordingly, there is a problem that the inclination angle of the sidewall of the cavity C increases (a difference between an upper width and a lower width of the cavity increases).

In addition, as shown in FIG. 2, in the second comparative example, the widths of the stop layer and the cavity 'C' are made the same, so that the stop pattern 34 is not remain on the circuit board. However, it is not easy to actually form the cavity C to correspond to the width of the stop layer due to process errors in the laser process. Accordingly, if the width of the stop layer is larger than the width of the cavity (C), there is a problem that a part of the stop pattern 34 as shown in FIG. 1 remains. Additionally, in the second comparative example, when the width of the stop layer is smaller than the width of the cavity (C), the cavity (C) is formed even in a region where the stop layer is not disposed. Accordingly, there is a problem in that a recess portion **10*r* is formed on the upper surface of the first insulating layer 10. In addition, damage may occur to the second circuit pattern layer 40 due to the recess portion 10*r*, and accordingly, electrical reliability or physical reliability problems may occur. In addition, the circuit board of the second comparative example also includes a protective layer 70 including the open portion 71** corresponding to the first comparative example. In addition, a dead region DR is included in the circuit board of the second comparative example.

In this case, in the first and second comparative examples, process conditions may be set so that the open portion 71 and the cavity C of the protective layer 70 have the same width. However, the open portion 71 is formed through exposure and development processes, and accordingly, there is a limit to forming the open portion 71 and the cavity C to have the same width due to process deviation. In addition, even if the process conditions are set so that the open portion 71 and the cavity C have the same width, the width of the open portion 71 may be smaller than the width of the cavity C due to the process deviation occurring in the process of forming the open portion 71. Accordingly, additional reliability problems such as the inability of the chip to be disposed at the correct position within the cavity C.

Accordingly, the embodiment provides a circuit board with a new structure that can solve the problems of the first and second comparative examples and a package substrate including the same.

For example, the embodiment allows a cavity to be formed in the circuit board through a laser process without a stop layer. To this end, the embodiment allows the cavity to be formed using a laser beam having a Top-Hat distribution in which the energy distribution is homogeneous. Accordingly, the embodiment allows the roughness of the lower surface of the cavity to be reduced compared to the comparative example. Furthermore, the embodiment allows the angle of inclination of the sidewall of the cavity to be improved compared to the comparative example. Furthermore, the embodiment allows the laser mask used to improve the angle of inclination to be removed. Furthermore, the embodiment allows the formation of a protective layer including an open portion before the process of forming the cavity through the improvement of the laser mask. Accordingly, the embodiment allows the width of the open portion of the protective layer and the width of the cavity to be the same to minimize dead region.

This will be explained in more detail below.

—Electronic Device—

Before describing the embodiment, a package substrate having a structure in which a chip is mounted on a circuit board of an embodiment may be included in an electronic device.

In this case, the electronic device includes a main board (not shown). The main board may be physically and/or electrically connected to various components. For example, the main board may be connected to the semiconductor package of the embodiment. Various semiconductor devices may be mounted on the semiconductor package. To explain broadly, memory chips such as volatile memory (e.g., DRAM), non-volatile memory (e.g., ROM), and flash memory, application processor chips such as a central processor (e.g., CPU), graphics processor (e.g., GPU), digital signal processor, cryptographic processor, microprocessor, and microcontroller, and logic chips such as analog-digital converters and ASICs (application-specific ICs) can be mounted on the package substrate.

Additionally, the embodiment provides a package substrate that can mount two or more chips of different types on one substrate while reducing the thickness of the package substrate connected to the main board of the electronic device.

In this case, the electronic device may be a smart phone, a personal digital assistant, a digital video camera, a digital still camera, a vehicle, a high-performance server, a network system, computer, monitor, tablet, laptop, netbook, television, video game, smart watch, automotive, or the like. However, the embodiment is not limited thereto, and may be any other electronic device that processes data in addition to these.

Hereinafter, a circuit board according to an embodiment and a package substrate including the same will be described.

—Circuit Board—

Hereinafter, embodiments of the present invention will be described in detail with reference to the accompanying drawings.

Figure 3:
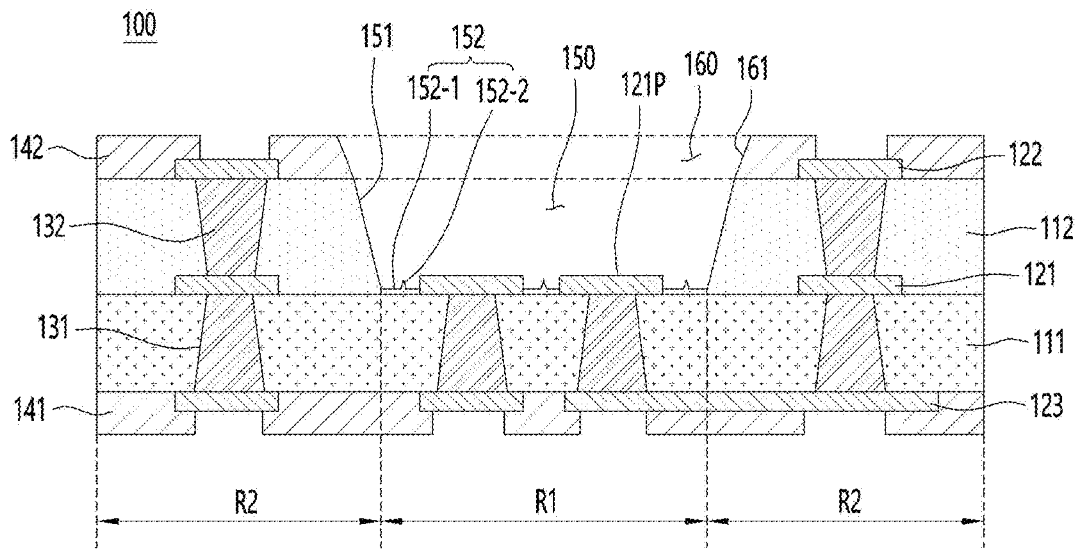
FIG. 3 is a view illustrating a circuit board according to an embodiment.
Figure 4:
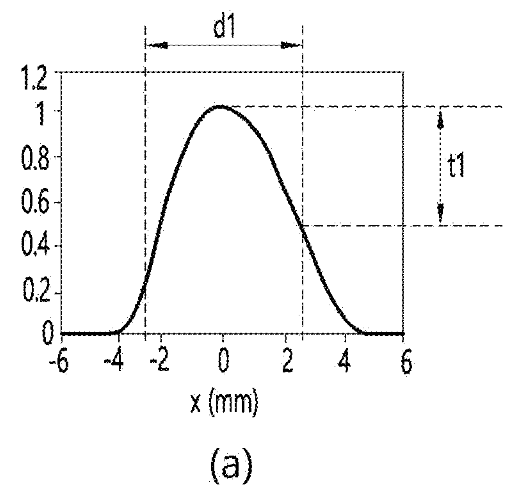
FIG. 4 is a view for explaining a laser beam of a Gaussian distribution compared to an embodiment.
Figure 4:
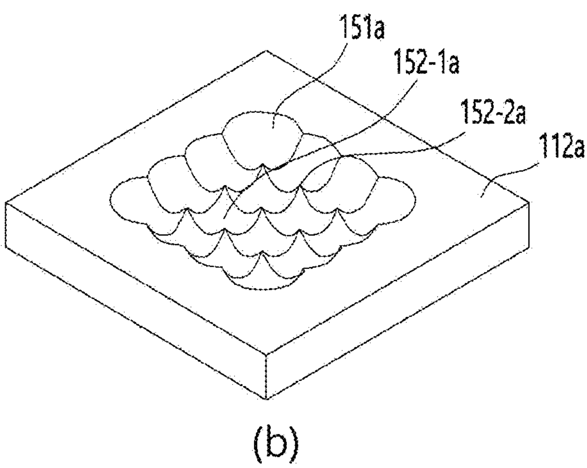
Figure 5:
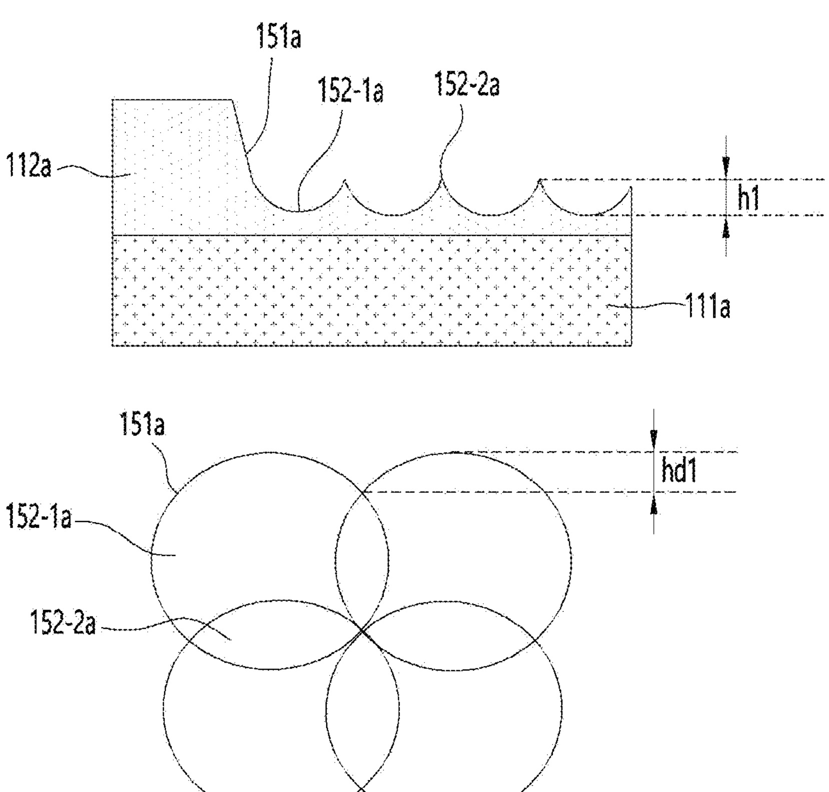
FIG. 5 is a view for describing a cavity formed by a laser beam of a Gaussian distribution of FIG. 4.
Figure 6:
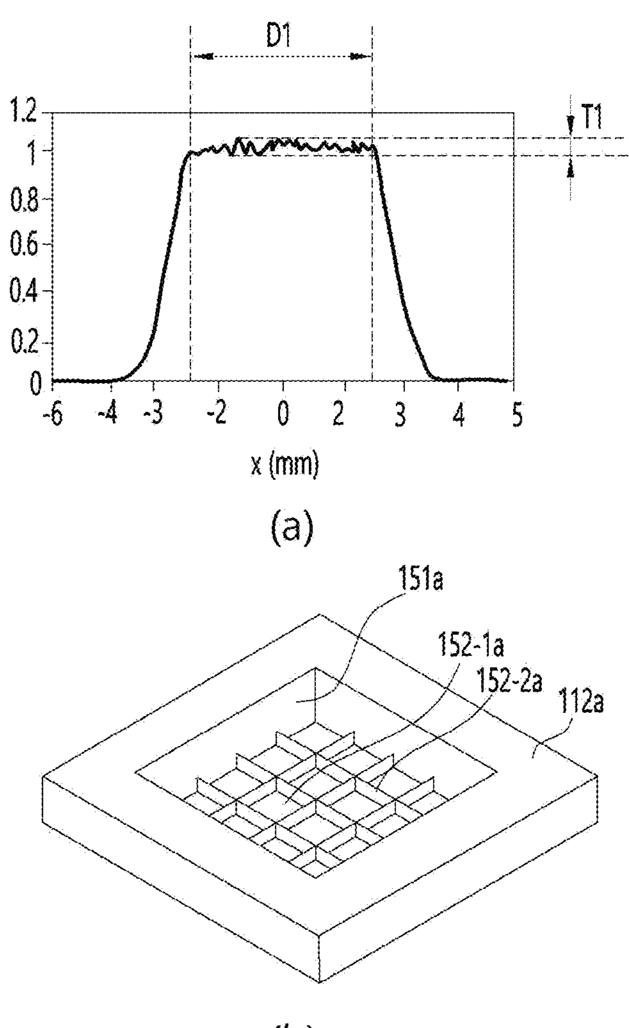
FIG. 6 is a view for describing a laser beam of a top-hat distribution according to an embodiment.
Figure 7:
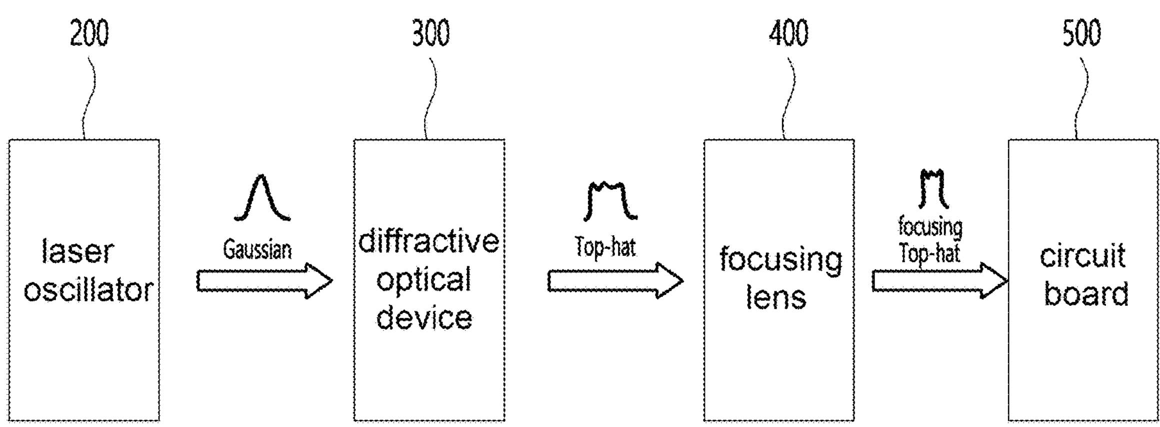
FIG. 7 is a view for describing a laser device irradiating a laser beam of a top-hat distribution according to an embodiment.
Figure 8:
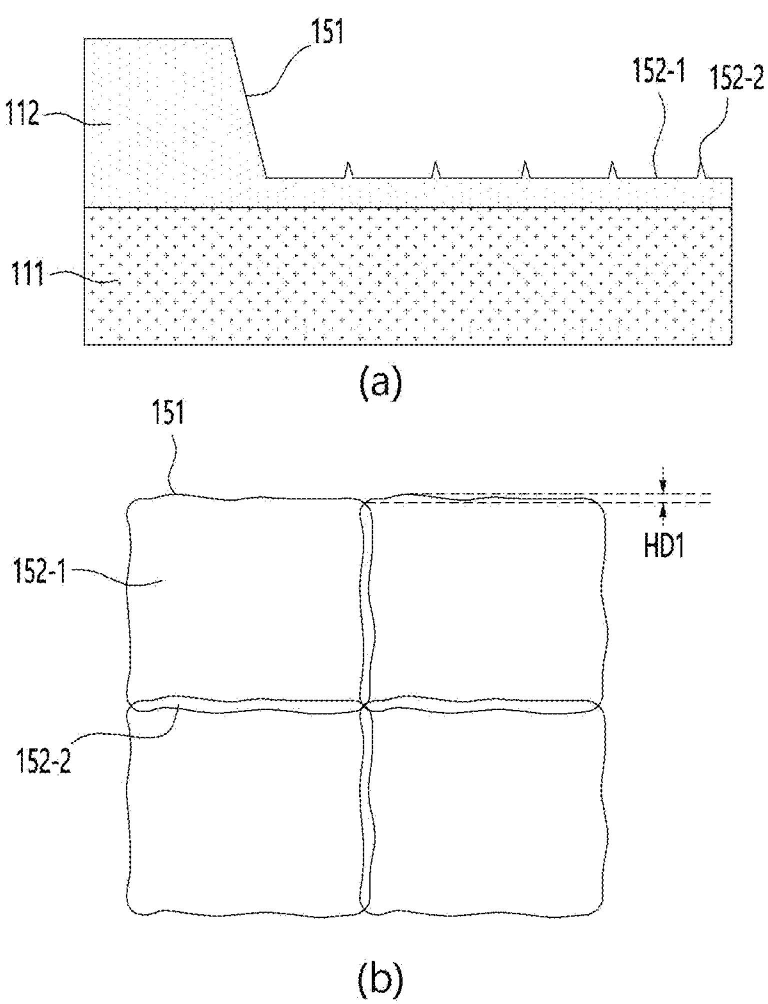
FIG. 8 is a view for describing a cavity formed by a laser beam of a top-hat distribution according to an embodiment.
Figure 9:
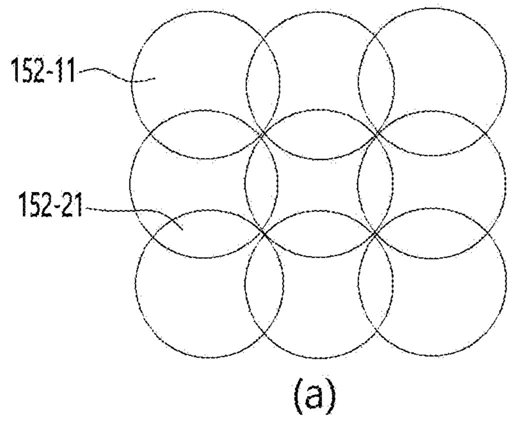
FIG. 9 is a view illustrating a modified example of a first portion of a lower surface of a cavity according to an embodiment.
Figure 9:
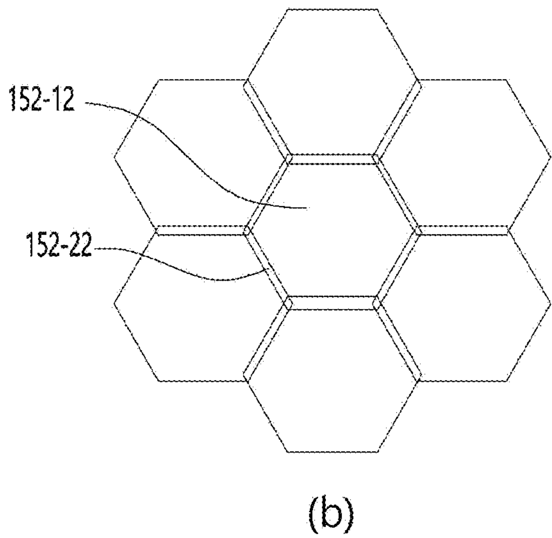
Figure 10:
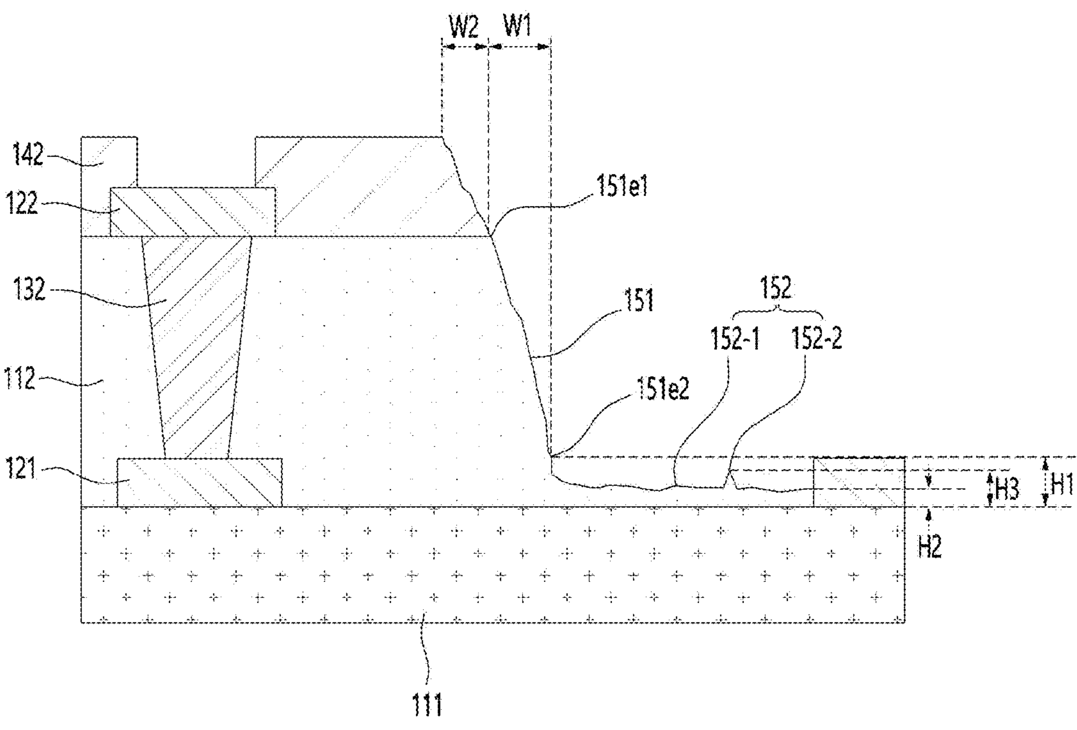
FIG. 10 is an enlarged view of some regions of the circuit board of FIG. 3.

FIG. 3 is a view illustrating a circuit board according to an embodiment, FIG. 4 is a view for explaining a laser beam of a Gaussian distribution compared to an embodiment, FIG. 5 is a view for describing a cavity formed by a laser beam of a Gaussian distribution of FIG. 4, FIG. 6 is a view for describing a laser beam of a top-hat distribution according to an embodiment, FIG. 7 is a view for describing a laser device irradiating a laser beam of a top-hat distribution according to an embodiment, FIG. 8 is a view for describing a cavity formed by a laser beam of a top-hat distribution according to an embodiment, FIG. 9 is a view illustrating a modified example of a first portion of a lower surface of a cavity according to an embodiment, and FIG. 10 is an enlarged view of some regions of the circuit board of FIG. 3.

Hereinafter, a specific shape and structure of a circuit board and a cavity included in the circuit board according to an embodiment will be described with reference to FIGS. 3 to 10.

The circuit board 100 according to an embodiment includes a first insulating layer 111, a second insulating layer 112, a first circuit pattern layer 122, a third circuit pattern layer 123, a first through electrode 131, a second through electrode 132, a first protective layer 141, and a second protective layer 142.

The insulating layer may include a first insulating layer 111 and a second insulating layer 112. However, a layer structure of the insulating layer of the embodiment is not limited thereto. For example, an additional insulating layer may be stacked on a lower surface of the first insulating layer 111 or an upper surface of the second insulating layer 112. For example, the insulating layer of the embodiment may have a layer structure of three or more layers.

The first insulating layer 111 and the second insulating layer 112 are substrates in which electrical circuits capable of changing wiring are arranged, and may include all prints, wiring boards, and insulating substrates made of insulating materials capable of forming circuit patterns on a surface.

For example, at least one of the first insulating layer 111 and the second insulating layer 112 may be rigid or flexible. For example, at least one of the first insulating layer 111 and the second insulating layer 112 may include glass or plastic. In detail, at least one of the first insulating layer 111 and the second insulating layer 112 may include chemically strengthened/semi-tempered glass such as soda lime glass or aluminosilicate glass, or reinforced or soft plastics such as polyimide (PI), polyethylene terephthalate (PET), propylene glycol (PPG), and polycarbonate (PC), or sapphire.

In addition, at least one of the first insulating layer 111 and the second insulating layer 112 may include an optical isotropic film. For example, at least one of the first insulating layer 111 and the second insulating layer 112 may include a cyclic olefin copolymer (COC), a cyclic olefin polymer (COP), an optical isotropic polycarbonate (polycarbonate, PC) or photo isotropic polymethyl methacrylate (PMMA).

In addition, at least one of the first insulating layer 111 and the second insulating layer 112 may be formed of a material including an inorganic filler and an insulating resin. For example, as a material constituting the first insulating layer 111 and the second insulating layer 112, a resin containing a reinforcing material such as an inorganic filler such as silica or alumina may be used together with a thermosetting resin such as an epoxy resin and a thermoplastic resin such as polyimide, specifically, ABF (Ajinomoto Build-up Film), FR-4, BT (Bismaleimide Triazine), PID (Photo Imageable Dielectric resin), BT, etc.

In addition, at least one of the first insulating layer 111 and the second insulating layer 112 may be partially bent having a curved surface. That is, at least one of the first insulating layer 111 and the second insulating layer 112 may partially have a plane and may partially be bent having a curved surface. Specifically, at least one of the first insulating layer 111 and the second insulating layer 112 may be bent while having a curved end or may be bent or curved with a surface including a random curvature.

The first insulating layer 111 and the second insulating layer 112 may include the same insulating material, and differently, may include different insulating materials. For example, the first insulating layer 121 may include a prepreg, and the second insulating layer 112 may be a resin coated copper (RCC).

Each thickness of the first insulating layer 111 and the second insulating layer 112 may satisfy a range of 10 μm to 60 μm. For example, each thickness of the first insulating layer 111 and the second insulating layer 112 may satisfy a range of 12 μm to 45 μm. For example, each thickness of the first insulating layer 111 and the second insulating layer 112 may satisfy a range of 15 μm to 30 μm.

However, although the first insulating layer 111 and the second insulating layer 112 are shown to have the same thickness, the embodiment is not limited thereto. For example, the first insulating layer 111 and the second insulating layer 112 may have different thicknesses.

For example, the first insulating layer 111 may satisfy a range of 10 μm to 60 μm. In addition, the second insulating layer 112 may have a thickness smaller or greater than that of the first insulating layer 111 within a range of 10 μm to 60 μm.

Each thickness of the first insulating layer 111 and the second insulating layer 112 may mean a vertical distance between circuit layers adjacent to each other in a thickness direction. For example, the thickness of the first insulating layer 111 may mean a vertical distance between a lower surface of the first circuit pattern layer 121 and an upper surface of the third circuit pattern layer 123. For example, the thickness of the second insulating layer 112 may mean a vertical distance between an upper surface of the first circuit pattern layer 121 and a lower surface of the second circuit pattern layer 122.

When the thickness of each of the first insulating layer 111 and the second insulating layer 112 is less than 10 μm, a distance between adjacent circuit layers in the thickness direction correspondingly becomes close, and thus operating characteristics due to signal interference therebetween may be deteriorated. In addition, when the thicknesses of the first insulating layer 111 and the second insulating layer 112 exceed 60 μm, the overall thickness of the circuit board may increase. In addition, when the thickness of each of the first insulating layer 111 and the second insulating layer 112 exceeds 60 μm, the thickness of the through electrode may correspondingly increase, and accordingly, the signal transmission distance may increase, thereby increasing signal transmission loss.

Meanwhile, the second insulating layer 112 may include a cavity 150. The cavity 150 may not pass through the second insulating layer 112.

In this case, an embodiment illustrates that the cavity 150 is formed in the second insulating layer 112 having one layer, but is not limited thereto. For example, the second insulating layer 112 may have a structure of two or more layers, and accordingly, the cavity 150 may be formed in a second insulating layer of two or more layers.

In addition, that the cavity 150 has a non-passing structure may mean that a lower surface 152 of the cavity 150 is located higher than the upper surface of the first insulating layer 111.

That is, in an embodiment, the cavity 150 is formed through the adjustment of a laser condition in the state in which the stopper layer is not formed. Accordingly, the lower surface 152 of the cavity 150 may be positioned in a region between an upper surface of the first insulating layer 111 and an upper surface of the first circuit pattern layer 121. For example, in an embodiment, in order to form the cavity 150 in a non-passing structure in an absence of the stopper layer, the laser condition may be adjusted such that the lower surface 152 of the cavity 150 is positioned between the upper surface of the first insulating layer 111 and the upper surface of the first circuit pattern layer 121.

The cavity 150 includes a sidewall 151 and a lower surface 152. The sidewall 151 of the cavity 150 may have a predetermined inclination.

An inclination angle of the sidewall 151 of the cavity 150 may be close to 90 degrees. The inclination angle of the sidewall 151 of the cavity 150 may mean an inner angle between the sidewall 151 of the cavity 150 and the upper surface of the first region R1 of the first insulating layer 111. The inclination angle of the sidewall 151 of the cavity 150 may satisfy a range between 91 and 110 degrees. Preferably, the inclination angle of the sidewall 151 of the cavity 150 may satisfy a range between 92 and 105 degrees. More preferably, the inclination angle of the sidewall 151 of the cavity 150 may satisfy a range between 93 and 100 degrees.

When the inclination angle of the sidewall 151 of the cavity 150 is less than 91 degrees, the inclination angle of the sidewall 151 may have an acute angle according to processing conditions of the cavity 150. And, when the inclination angle has an acute angle, processability may be deteriorated in a process of mounting the device in the cavity 150.

In addition, when the inclination angle of the sidewall 151 of the cavity 150 is less than 91 degrees, a problem in which a position of the device is misaligned may occur in a process of mounting the device in the cavity 150. Accordingly, the mountability of the device may be deteriorated.

In addition, when the inclination angle of the sidewall 151 of the cavity 150 exceeds 110 degrees, a difference between an upper width of the cavity 150 (e.g., the region adjacent to the upper surface of the second insulating layer 112 among an entire region in the thickness direction of the cavity 150) and a lower width of the cavity 150 (e.g., a region adjacent to the lower surface of the second insulating layer 112 among the entire region in the thickness direction of the cavity 150) may increase. And, when the difference between the lower width and the upper width of the cavity 150 increases, an area of the dead region in which the circuit pattern is not disposed increases, and accordingly, the circuit integration may decrease or the overall volume of the circuit board may increase.

In this case, the sidewall 151 of the cavity 150 may have a curvature. Here, the curvature of the sidewall 151 may mean that the sidewall 151 of the cavity 150 does not have a predetermined inclination in the thickness direction of the second insulating layer 112 due to a deviation in roughness of the sidewall 151 of the cavity 150. For example, the sidewall of the cavity 150 may include a convex portion (not shown) which is convex toward the cavity 150, and a concave portion (not shown) which is concave toward the inside of the second insulating layer 112.

And, when the sidewall 151 of the cavity 150 has a curvature, the inclination angle of the sidewall 151 may mean an inclination angle of a virtual straight line connecting a first end and a second end of the sidewall 151. The first end of the sidewall 151 may mean a portion of the sidewall 151 adjacent to the upper surface of the second insulating layer 112. The second end of the sidewall 151 may mean a portion adjacent to the lower surface 152, a portion adjacent to the lower surface of the second insulating layer 112, or a portion adjacent to the upper surface of the first insulating layer 111. The first and second ends of the sidewall 151 will be described in more detail below.

The lower surface 152 of the cavity 150 according to an embodiment may be divided into a plurality of portions.

For example, the lower surface 152 of the cavity 150 may include a first portion 152-1 and a second portion 152-2. For example, the lower surface 152 of the cavity 150 includes a plurality of first portions 152-1. Also, the lower surface 152 of the cavity 150 includes a plurality of second portions 152-2 disposed between a plurality of first portions 152-1. Each of the plurality of second portions 152-2 may be disposed between two adjacent first portions 152-1.

A planar shape of the first portion 152-1 of the lower surface 152 of cavity 150 may have a square shape. For example, the planar shape of the first portion 152-1 of the lower surface 152 of cavity 150 may be a rectangle or a square. However, the embodiment is not limited thereto. For example, the planar shape of the first portion 152-1 of the lower surface 152 of cavity 150 may have a square shape with a curved corner or a square shape with at least one corner cut off.

In this case, the first portion 152-1 of the lower surface 152 of the cavity 150 may mean a portion having a constant (or uniform) height of an entire region of the lower surface 152. For example, the first portion 152-1 of the lower surface 152 of the cavity 150 may be a flat portion.

Here, the constant height may mean that a height difference between a portion having a highest height and a portion having a lowest height in the entire region of the first portion 152-1 is 1 μm or less, 0.8 μm or less, or 0.5 μm or less. The height difference may mean a thickness difference or a distance difference in a vertical direction.

In addition, the fact that the first portion 152-1 is flat means that a height difference between the portion having the highest height and the portion having the lowest height in the overall region of the first portion 152-1 is less than 1 μm, less than 0.8 μm, or less than 0.5 μm.

For example, the first portion 152-1 of the lower surface 152 of the cavity 150 may have a certain curvature according to roughness. However, a height difference or a distance difference in a vertical direction between the highest and lowest portions of the first portion 152-1 of the lower surface 152 of the cavity 150 may be 1 μm or less, 0.8 μm or less, or 0.5 μm or less.

That is, in an embodiment, when the cavity 150 is formed, the cavity 150 is formed using a laser beam having a quadrilateral or quadrilateral shape having a uniform top-hat distribution in a cross section. Accordingly, the first portion 152-1 of the lower surface 152 of the cavity 150 may be formed to be substantially flat by the laser beam having the top-hat distribution. However, the laser beam having the top-hat distribution may have a difference in peak power in a predetermined unit area. In this case, the difference in peak power is substantially difficult to distinguish, and accordingly, the first portion 152-1 is substantially flat or has a height difference of 1 μm or less, 0.8 μm or less, or 0.5 μm or less.

The lower surface 152 of the cavity 150 includes a second portion 152-2 adjacent to the first portion 152-1. The second portion 152-2 may be located between a plurality of first portions 152-1. For example, when the planar shape of the first portion 152-1 has the quadrangle shape, the second portion 152-2 may be located adjacent to each of four sides of the quadrangle. For example, the second portion 152-2 may be provided along a circumferential direction of the first portion 152-1, and may have a circumferential shape of the first portion 152-1.

The second portion 152-2 of the lower surface 152 of the cavity 150 may be a region processed by an edge portion of the laser beam having the top-hat distribution. For example, the second portion 152-2 may have a shape of a side corresponding to each of the sides of the square shape of the first portion 152-1. For example, the second portion 152-2 may have a shape of a circumference provided along the circumference of the square shape of the first portion 152-1.

Specifically, the first portion 152-1 of the lower surface 152 of the cavity 150 is a region processed by the central portion of the laser beam having the top-hat distribution. Thus, the first portion 152-1 may be flat as described above.

However, the second portion 152-2 of the lower surface 152 of the cavity 150 is a region processed by the edge region of the laser beam having the top-hat distribution. Accordingly, the second portion 152-2 of the lower surface 152 of the cavity 150 according to the first embodiment may protrude with a certain height. Preferably, the second portion 152-2 of the lower surface 152 of the cavity 150 may be located higher than the first portion 152-1 of the lower surface 152 of the cavity 150.

That is, the process of forming the cavity 150 is performed by irradiating while moving the laser beam of the top-hat distribution along a cavity processing line. For example, irradiation of the laser beam includes irradiating a first laser beam of the top-hat distribution and irradiating the second laser beam of at least a portion overlapping the first laser beam along the cavity processing line. In this case, when the overlapping region of the first laser beam and the second laser beam increases, a height of the second portion 152-2 of the lower surface 152 of the cavity 150 may be reduced or the second portion 152-2 of the lower surface 152 of the cavity 150 may be removed. Also, in this case, the second portion 152-2 of the lower surface 152 of the cavity 150 may have a problem formed in the first insulating layer 111 rather than the second insulating layer 112.

For example, the overlapping region of the first laser beam and the second laser beam may be adjusted. Accordingly, the second portion 152-2 of the lower surface 152 of the cavity 150 may protrude upward (e.g., toward the upper surface of the second insulating layer) with respect to the first portion 152-1, or may be recessed downward (e.g., toward the upper surface of the first insulating layer). In addition, in the first embodiment, the overlapping region may be adjusted such that the second portion 152-2 protrudes upward with respect to the height of the first portion 152-1.

For example, when the overlapping region of the first laser beam and the second laser beam increases, there may be a problem that the laser beam in the overlapping region passes through the second insulating layer 112 and processes a part of the upper surface of the first insulating layer 111. Accordingly, in the embodiment, the second portion 152-2 is positioned between a plurality of first portions 152-1 of the lower surface 152 of the cavity 150 by adjusting the overlapping region of the first laser beam and the second laser beam. For example, the second portion 152-2 of the lower surface 152 of the cavity 150 may mean a region processed in the edge region of the first laser beam and the edge region of the second laser beam. Accordingly, the second portion 152-2 of the lower surface 152 of the cavity 150 may have a protruding shape with a predetermined height compared to the first portion 152-1.

In other words, the planar shape of the lower surface 152 of the cavity 150 in the embodiment may have a waffle shape including a plurality of first portions 152-1 and a second portion 152-2 between the plurality of first portions 152-1. In addition, the planar shape of the lower surface 152 of the cavity 150 may have a honeycomb shape depending on the planar shape of the first portion 152-1.

The specific features of the cavity 150 and the difference between the cavity formed by the laser beam of the Top-hat distribution of the embodiment will be described in more detail below.

Meanwhile, a circuit pattern layer may be disposed on surfaces of the first insulating layer 111 and the second insulating layer 112.

For example, a first circuit pattern layer 121 may be disposed between the upper surface of the first insulating layer 111 and the lower surface of the second insulating layer 112. For example, the first circuit pattern layer 121 may be disposed on the upper surface of the first insulating layer 111.

Also, a second circuit pattern layer 122 may be disposed on the upper surface of the second insulating layer 112. For example, the second circuit pattern layer 122 may be disposed on the upper surface of the second insulating layer 112.

Also, a third circuit pattern layer 123 may be disposed on the lower surface of the first insulating layer 111. For example, the third circuit pattern layer 123 may be disposed under the lower surface of the first insulating layer 111.

The first circuit pattern layer 121, the second circuit pattern layer 122, and the third circuit pattern layer 123 are wires that transmit electrical signals and may be formed of a metal material having high electrical conductivity. To this end, the first circuit pattern layer 121, the second circuit pattern layer 122, and the third circuit pattern layer 123 may be formed of at least one metal material selected from gold (Au), silver (Ag), platinum (Pt), titanium (Ti), tin (Sn), copper (Cu), and zinc (Zn). Also, the first circuit pattern layer 121, the second circuit pattern layer 122, and the third circuit pattern layer 123 may be formed of a paste or a solder paste including at least one metal material selected from among gold (Au), silver (Ag), platinum (Pt), titanium (Ti), tin (Sn), copper (Cu), and zinc (Zn), which have excellent bonding strength. Preferably, the first circuit pattern layer 121, the second circuit pattern layer 122, and the third circuit pattern layer 123 may be formed of copper (Cu) which has high electrical conductivity and is relatively inexpensive.

Each of the first circuit pattern layer 121, the second circuit pattern layer 122, and the third circuit pattern layer 123 may have a thickness in a range of 5 μm to 30 μm. For example, each of the first circuit pattern layer 121, the second circuit pattern layer 122, and the third circuit pattern layer 123 may have a thickness in a range of 8 μm to 25 μm. For example, each of the first circuit pattern layer 121, the second circuit pattern layer 122, and the third circuit pattern layer 123 may have a thickness in a range of 10 μm to 20 μm. When the thicknesses of the first circuit pattern layer 121, the second circuit pattern layer 122, and the third circuit pattern layer 123 are less than 5 μm, the resistance of the circuit pattern increases, and thus the signal transmission loss may increase. When the thicknesses of the first circuit pattern layer 121, the second circuit pattern layer 122, and the third circuit pattern layer 123 are less than 5 μm, an allowable current of a signal that may be transmitted to the corresponding circuit pattern layer decreases, and thus a problem in communication performance may occur, such as a decrease in a signal transmission speed. In addition, when the thicknesses of the first circuit pattern layer 121, the second circuit pattern layer 122, and the third circuit pattern layer 123 exceed 30 μm, a line width of the corresponding circuit pattern increases accordingly, and thus it may be difficult to refine the circuit pattern accordingly. In addition, when the thicknesses of the first circuit pattern layer 121, the second circuit pattern layer 122, and the third circuit pattern layer 123 exceed 30 μm, the thickness of the circuit board may increase correspondingly.

The first circuit pattern layer 121, the second circuit pattern layer 122, and the third circuit pattern layer 123 may be formed by an Additive process, a Subtractive process, a MSAP (Modified Semi Additive Process), and a Semi Additive Process (SAP) method, which are typical manufacturing processes of a printed circuit board, and a detailed description thereof will be omitted. And, the first circuit pattern layer 121, the second circuit pattern layer 122, and the third circuit pattern layer 123 may have different layer structures according to a manufacturing method. For example, each of the first circuit pattern layer 121, the second circuit pattern layer 122, and the third circuit pattern layer 123 may have a three-layer structure as manufactured by an MSAP method. For another example, the first circuit pattern layer 121, the second circuit pattern layer 122, and the third circuit pattern layer 123 may have a two-layer structure as manufactured by an SAP method. For example, when the MSAP method is used, the first circuit pattern layer 121, the second circuit pattern layer 122, and the third circuit pattern layer 123 may each include a copper foil layer, a chemical copper plating layer, and an electroplating layer. In addition, when the SAP method is used, the first circuit pattern layer 121, the second circuit pattern layer 122, and the third circuit pattern layer 123 may each include a chemical copper plating layer and an electroplating layer.

Meanwhile, the first circuit pattern layer 121, the second circuit pattern layer 122, and the third circuit pattern layer 123 each include traces and pads.

Trace refers to a wiring in the form of a long line that transmits an electrical signal. In addition, the pad may be a mounting pad on which components such as chips are mounted, a core pad or a BGA pad for connection with an external board, or a through electrode pad connected to a through electrode.

In particular, the first circuit pattern layer 121 may include a pad 121P. The pad 121P may mean a mounting pad on which a device is mounted later.

Specifically, the upper surface of the first insulating layer 111 includes a first region R1 that vertically overlaps the cavity 150 and does not contact the second insulating layer 112. For example, the first region R1 may mean a region that vertically overlaps the lower surface 152 of the cavity 150 without vertically overlapping the sidewall 151 of the cavity 150.

Also, the upper surface of the first insulating layer 111 may include a second region R2 in contact with the second insulating layer 112. The second region R2 of the upper surface of the first insulating layer 111 may mean a region vertically overlapping the sidewall 151 of the cavity 150 without vertically overlapping the lower surface 152 of the cavity 150.

The pad 121P of the first circuit pattern layer 121 may be disposed on the first region R1 of the first insulating layer 111. The pad 121P vertically overlaps the cavity 150, and thus an upper surface of the pad 121P may be exposed through the cavity 150. Accordingly, the pad 121P may function as a mounting pad connected to the device when the device is mounted in the cavity 150. The pad 121P may be in contact with the second insulating layer 112. Preferably, at least a portion of a side surface of the pad 121P may be in contact with the second insulating layer 112. That is, at least a portion of the side surface of the pad 121P may be covered with the second insulating layer 112 corresponding to the lower surface 152 of the cavity 150.

A first protective layer 141 may be disposed on the lower surface of the first insulating layer 111.

The first protective layer 141 may include an opening (not shown) vertically overlapping the lower surface of the third circuit pattern layer 123 and exposing at least a portion of the lower surface of the third circuit pattern layer 123.

Also, a second protective layer 142 may be disposed on the upper surface of the second insulating layer 112. The second protective layer 142 may include an opening (not shown) exposing at least a portion of the upper surface of the third circuit pattern layer 123 while vertically overlapping the upper surface of the first circuit pattern layer 121.

The first protective layer 141 and the second protective layer 142 may be resist layers. For example, the first protective layer 141 and the second protective layer 142 may be solder resist layers including an organic polymer material. For example, the first protective layer 141 and the second protective layer 142 may include an epoxy acrylate-based resin. Specifically, the first protective layer 141 and the second protective layer 142 may include a resin, a curing agent, a photo initiator, a pigment, a solvent, a filler, an additive, an acrylic-based monomer, and the like. However, embodiments are not limited thereto, and the first protective layer 141 and the second protective layer 142 may be any one of a photo solder resist layer, a cover-lay, and a polymer material.

The first protective layer 141 and the second protective layer 142 may have a thickness of about 1 μm to about 20 μm. The first protective layer 141 and the second protective layer 142 may have a thickness of about 1 μm to about 15 μm. For example, the first protective layer 141 and the second protective layer 142 may have a thickness of about 5 μm to about 20 μm. When the thicknesses of the first protective layer 141 and the second protective layer 142 are greater than about 20 μm, the thickness of the circuit board may increase. When the thicknesses of the first protective layer 141 and the second protective layer 142 are less than about 1 μm, the electrical reliability or physical reliability may be deteriorated because circuit pattern layers included in the circuit board are not stably protected.

Meanwhile, the circuit board of the embodiment includes a through electrode. The through electrode may electrically connect circuit pattern layers disposed on different layers.

For example, a first through electrode 131 is disposed in the first insulating layer 111. The first through electrode 131 passes through the first insulating layer 111. The first through electrode 131 may connect the first circuit pattern layer 121 and the third circuit pattern layer 123.

For example, a second through electrode 132 is disposed in the second insulating layer 112. The second through electrode 132 may connect the first circuit pattern layer 121 and the second circuit pattern layer 122.

The through electrodes 131 and 132 as described above may be formed by filling the inside of the through hole formed in each insulating layer with a conductive material. The through hole may be formed by any one of mechanical, laser, and chemical processing. When the through hole is formed by mechanical processing, a method such as milling, drill, and routing may be used, and when formed by laser processing, a UV or CO2 laser method may be used, and when formed by chemical processing, chemicals including amino silane and ketones. Accordingly, the insulating layer may be opened.

If the through hole is formed, the inside of the through hole may be filled with a conductive material to form the through electrodes 131 and 132. The through electrodes 131 and 132 may be formed of any one metal material selected from copper (Cu), silver (Ag), tin (Sn), gold (Au), nickel (Ni), and palladium (Pd). In addition, the filling of the conductive material may be performed by any one of electroless plating, electroplating, screen printing, sputtering, evaporation, ink jetting, and dispensing, or a combination thereof.

Hereinafter, a cavity formed by a laser beam of a Top-hat distribution according to an embodiment and a cavity formed by a laser beam of a Gaussian distribution compared thereto will be described.

As shown in FIG. 4(*a*), the laser beam of the Gaussian distribution has a highest power at ae center, and has a convex shape in which power decreases as the distance from the center increases. For example, in a constant unit area d1 of the Gaussian distribution laser beam, the difference t1 between the part having the greatest power and the part having the smallest power is greater than the laser beam of the Top-hat distribution of the embodiment.

In addition, when a cavity is formed using the Gaussian distribution laser beam, the height difference for each region of the lower surface of the cavity increases corresponding to the difference t1 of the laser beam.

For example, as shown in FIG. 4(*b*), when a cavity is formed in the second insulating layer 112*a* using the laser beam having the Gaussian distribution, the cavity includes a sidewall 151*a* and a lower surface 152*a*. And the lower surface 152*a* of the cavity includes a first portion 152-1*a* and a second portion 152-2*a*.

In this case, the first portion 152-1*a* of the lower surface 152*a* of the cavity formed by the laser beam of the Gaussian distribution has a height difference corresponding to the power difference of the laser beam of the Gaussian distribution. For example, as shown in FIG. 5(*a*), the first portion 152-1*a* of the lower surface 152*a* of the cavity includes a concave portion toward the first insulating layer 111*a*.

In addition, the first portion 152-1*a* of the lower surface 152*a* of the cavity is not flat and has a concave shape toward a lower side. Accordingly, when a laser beam having a Gaussian distribution is used, there is a problem that the height difference of the first portion 152-1*a* of the lower surface 152*a* of the cavity increases. For example, in the case of a cavity formed by using a laser beam having a Gaussian distribution, the height difference between the highest height and the lowest height in the first portion 152-1*a* of the lower surface 152*a* may exceed 7 μm, 8 μm, or 10 μm. Accordingly, when a cavity is formed using a laser beam having a Gaussian distribution, it is difficult to determine the exact height of the lower surface 152*a* of the cavity. In this case, when the lower surface 152*a* of the cavity is adjusted too low, there is a problem in that a part of the upper surface of the first insulating layer 111*a* is processed. In addition, when the lower surface 152*a* of the cavity 150 is adjusted too high, a problem that at least a portion of the upper surface of the pad 121P is covered with the second insulating layer 112*a* may occur. In addition, when the lower surface 152*a* of the cavity 150 is adjusted too high, reliability problems such as tilting the device may occur in the process of mounting the device on the pad 121P.

Furthermore, the second portion 152-2*a* of the lower surface 152*a* of the cavity is processed by the edge portion of the laser beam with a relatively weak power distribution, and thus has a relatively high height. For example, the height h1 between the second portion 152-2*a* and the first portion 152-1*a* of the lower surface 152*a* of the cavity may be greater than 8 μm, greater than 10 μm, or greater than 15 μm. Accordingly, when a laser beam having a Gaussian distribution is used, it may be difficult to process a stable cavity without a stopper layer.

In conclusion, a shape of the cavity formed using a Gaussian distribution laser beam has an egg plate shape including a lower surface 152*a* with a large height difference depending on the location.

In addition, the sidewall 151*a* of the cavity formed by using the laser beam of the Gaussian distribution is processed by the edge portion of the laser beam of the relatively weak intensity, so that the inclination angle of the sidewall 151*a* may exceed 120 degrees, 125 degrees, or 130 degrees. In addition, when the inclination angle of the sidewall 151*a* increases, the difference between the upper width and the lower width of the cavity increases accordingly. In addition, when the difference between the upper width and the lower width of the cavity increases, the area of the dead region increases, and accordingly, the circuit integration may decrease, or the volume of the circuit board may increase.

In this case, when the cavity is formed using a laser beam having a Gaussian distribution, the cavity processing is performed in a state in which a laser mask (not shown) is formed on the upper surface of the second insulating layer 112*a* to improve the inclination angle. In this case, when the cavity processing is performed in the state in which the laser mask is formed, a process of removing the laser mask must be performed after the cavity is formed. Accordingly, when processing the cavity using the laser mask, the protective layer disposed on the upper surface of the second insulating layer 112*a* may be formed after the cavity is formed. In addition, as previously described in FIGS. 1 and 2, when the protective layer is formed after the cavity is formed, there is a problem that the dead region increases due to the difference between the upper width of the cavity and the width of the open portion of the protective layer.

Meanwhile, as shown in FIG. 5(*b*), in the planar shape of the cavity formed by using the laser beam of the Gaussian distribution, the edge portion corresponding to the sidewall 151*a* of the cavity has a wavy shape. In this case, a horizontal distance hd1 between a portion located furthest from the cavity and a portion located closest to the cavity based on an edge of a plane of the cavity formed by the Gaussian distributed laser beam may exceed 3 μm, 4 μm, or 6 μm. In this case, a substantial size of the cavity is determined by a portion located closest to each other. In addition, a region between the portion located closest to the cavity and the portion located farthest from the cavity remains as a dead region, thereby acting as a factor to increase the overall volume of the circuit board.

Unlike this, as shown in FIG. 6(*a*), an embodiment processes the cavity 150 using the laser beam of the top-hat distribution. In this case, in the laser beam of the top hat distribution, a difference T1 between a portion with a greatest power and a portion with a smallest power is close to zero in a certain unit area D1. Accordingly, the embodiment processes the cavity 150 using the laser beam of the top-hat distribution, thereby minimizing the height difference for each region of the first portion 152-1 of the lower surface 152 of the cavity 150, and minimizing the height of the second portion 152-2.

Also, as shown in FIG. 6(*b*), when the cavity 150 is formed using the laser beam of the top-hat distribution, the inclination angle of the sidewall 151 of the cavity 150 may be substantially close to 90 degrees. Furthermore, the first portion 152-1 of the lower surface 152 of the cavity 150 may be flat with little difference in height for each region, and the height of the second portion 152-2 may be significantly reduced compared to the height h1 of FIG. 5.

For example, the height of the second portion 152-2 may be 5 μm or less, 3 μm or less, or 2 μm or less. Here, the height of the second portion 152-2 may mean a vertical distance between an uppermost end of the first portion 152-1 and an uppermost end of the second portion 152-2. In addition, in the first embodiment, the height of the second portion 152-2 protruding from the first portion 152-1 may be 1.2 μm or more, 1.4 μm or more, or 1.5 μm or more.

Furthermore, in the planar shape of the cavity formed by using the laser beam of the top-hat distribution, an edge portion corresponding to the sidewall 151 of the cavity has a substantially straight line shape. That is, in an edge of the plane of the cavity formed by the laser beam of the top-hat distribution, a horizontal distance HD1 between the farthest portion and the closest portion of the cavity may be 3 μm or less, 2 μm or less, 1 μm or less, or 0.5 μm or less. Accordingly, an embodiment may reduce the size of the cavity 150 compared to using a laser beam of a Gaussian distribution, thereby reducing the area of the dead region, thereby reducing the overall volume of the circuit board.

A laser apparatus for irradiating a laser beam of the top-hat distribution will be briefly described as follows.

As shown in FIG. 7, the laser device may include a laser oscillator 200, a diffractive optical device 300, and a focusing lens 400.

The laser oscillator 200 may irradiate a laser beam. The laser beam may be a laser beam having a Gaussian distribution.

The diffractive optical device 300 converts a laser beam of a Gaussian distribution irradiated from the laser oscillator 200 into a laser beam of a Top-hat distribution. To this end, the diffractive optical device 300 may have a predetermined planar shape and may have a structure in which irregular slits are formed. For example, a relatively small number of slits are formed in a central portion of the diffractive optical device 300, and a relatively large number of slits are formed in an edge portion around the central portion. Accordingly, when the laser beam of the Gaussian distribution passes through the slit of the diffractive optical device 300, a laser beam of a Top-hat distribution having a homogeneous energy distribution in the entire region of the laser beam may be generated. In this case, a planar shape of the diffractive optical device 300 may be a quadrangular shape. Accordingly, a planar shape of the first portion 152-1 of the lower surface 152 of the cavity 150 may have a quadrangular shape corresponding thereto. However, an embodiment is not limited thereto. For example, as shown in FIG. 9(*a*), the diffractive optical device 300 may have a circular shape, and accordingly, a planar shape of the first portion 151-11 of the lower surface 152 of the cavity 150 may have a circular shape. In this case, a planar shape of the second portion 152-21 of the lower surface 152 of the cavity 150 may have an elliptical shape. Also, as shown in FIG. 9(*b*), the diffractive optical device 300 may have a hexagonal shape, and accordingly, a planar shape of the first portion 151-12 of the lower surface 152 of the cavity 150 may have a hexagonal shape. In this case, the second portion 152-22 of the lower surface 152 of the cavity 150 may be located adjacent to each side of the hexagonal shape.

As described above, the laser beam of the Gaussian distribution irradiated by the laser oscillator 200 passes through the diffractive optical device 300, and accordingly, the laser beam of the Gaussian distribution may be converted into a laser beam of the Top-hat distribution.

The focusing lens 400 may focus a laser beam having a top-hat distribution converted in the diffractive optical device 300 to irradiate a cavity formation region of the circuit board 100. Accordingly, in an embodiment, a cavity 150 may include a lower surface 152-1 including a plurality of substantially flat first portions 152-1 and a second portion 152-2 having a certain height between a plurality of first portions 152-1 may be formed.

Hereinafter, the cavity 150 and an open portion 160 of the second protective layer 142 according to an embodiment will be described in more detail with reference to FIG. 10.

Referring to FIG. 10, in the embodiment, after the second protective layer 142 is formed and the open portion 160 is formed in the second protective layer 142, the second insulating layer 112 is processed to form the cavity 150.

Accordingly, a sidewall 161 of the open portion 160 of the second protective layer 142 according to an embodiment may have an inclination angle corresponding to the sidewall 151 of the cavity 150. For example, at least a portion of the laser beam of the top-hat distribution irradiated in the process of forming the cavity 150 is irradiated to the sidewall 161 of the second protective layer 142. As a result, the sidewall 161 of the second protective layer 142 may be formed by the laser beam of the top-hat distribution.

In embodiments, the lower surface 152 of the cavity 150 includes a first portion 152-1 and a second portion 152-2. In this case, a height H2 of the first portion 152-1 is smaller than a height H1 of the pad 121P. For example, the height H2 of the first portion 152-1 may satisfy a range from 5 to 70% of the height H1 of the pad 121P. In this case, the height H2 of the first portion 152-1 may also be referred to as a thickness of the first portion 152-1. Also, the height H1 of the pad 121P may also be referred to as the thickness of the pad 121P. The height H2 of the first portion 152-1 may satisfy a range from 7% to 65% of the height H1 of the pad 121P. The height H2 of the first portion 152-1 may satisfy a range from 10% to 60% of the height H1 of the pad 121P.

When the height H2 of the first portion 152-1 is less than 5% of the height H1 of the pad 121P, a part of the upper surface of the first insulating layer 111 may be processed due to a process deviation in the process of forming the cavity 150. When the height H2 of the first portion 152-1 exceeds 70% of the height H1 of the pad 121P, the height of the second portion 152-2 may be greater than the height of the pad 121P. In addition, when the height of the second portion 152-2 is greater than the height H1 of the pad 121P, the reliability may deteriorate in a process of mounting the device.

The height H3 of the second portion 152-2 may be higher than the height H2 of the first portion 152-1 and may satisfy a range of 10% to 80% of the height H1 of the pad 121P. The height H3 of the second portion 152-2 may be greater than the height H2 of the first portion 152-1 and may satisfy a range of 12% to 70% of the height H1 of the pad 121P. The height H3 of the second portion 152-2 may be greater than the height H2 of the first portion 152-1 and may satisfy a range of 15% to 65% of the height H1 of the pad 121P.

When the height H3 of the second portion 152-2 is less than 10% of the height H1 of the pad 121P, the first portion 152-1 of the lower surface 152 of the cavity 150 may be located lower than the upper surface of the first insulating layer 111 in the process of forming the cavity 150. When the height H3 of the second portion 152-2 exceeds 80% of the height H1 of the pad 121P, electrical reliability and physical reliability problems may occur in the process of mounting a device in the cavity 150.

Meanwhile, the cavity 150 according to an embodiment is formed by a laser beam having a top-hat distribution, and thus the inclination angle of the sidewall 151 of the cavity 150 may be substantially close to 90 degrees. In this case, the sidewall 151 of the cavity 150 may have a curvature as illustrated in FIG. 10. Thus, the inclination angle of the sidewall 151 of the cavity 150 may be expressed as a horizontal distance W1 between the first end 151*e*1 and the second end 151*e*2 of the sidewall 161 of the cavity 150.

At this time, the horizontal distance between the first end and the second end of the sidewall of the cavity formed using a Gaussian distribution laser beam without a laser mask exceeds 100 μm, exceeds 110 μm, or exceeds 120 μm.

Alternatively, in an embodiment, the horizontal distance W1 between the first end 151*e*1 and the second end 151*e*2 of the sidewall 151 of the cavity 150 may be 60 μm or less. For example, the horizontal distance W1 between the first end 151*e*1 and the second end 151*e*2 of the sidewall 151 of the cavity 150 may be 50 μm or less. For example, the horizontal distance W1 between the first end 151*e*1 and the second end 151*e*2 of the sidewall 151 of the cavity 150 may be 45 μm or less.

In this case, the first end 151*e*1 may refer to an end portion of the sidewalls 151 at one side of the cavity 150 that is closest to the upper surface of the second insulating layer 112. Also, the second end 151*e*2 may refer to an end portion of the sidewall 151 at the one side of the cavity 150 that is adjacent to a lower surface of the second insulating layer 112. Preferably, the second end 151*e*2 may refer to a portion of the sidewall 151 at one side of the cavity 150 that horizontally overlap the pads 121P.

In an embodiment, the horizontal distance W1 between the first end 151*e*1 and the second end 151*e*2 of the sidewall 151 of the cavity 150 may be formed to be 60 μm or less, 50 μm or less, or 45 μm or less, thereby reducing the difference between the upper width and the lower width of the cavity 150. Accordingly, in an embodiment, the size of the cavity 150 may be reduced, and thus the overall volume of the circuit board may be reduced while improving circuit integration. Meanwhile, the horizontal distance W1 between the first end 151*e*1 and the second end 151*e*2 may exceed 5 μm. This may be because the cavity 150 is formed using a laser beam having a top-hat distribution while maintaining processability in a laser process forming the cavity 150.

Meanwhile, the sidewall 161 of the second protective layer 142 of an embodiment may also have an inclination corresponding to the sidewall 161 of the cavity 150. Here, the corresponding inclination may mean that a difference between the inclination angle of the sidewall 151 of the cavity 150 and the inclination angle of the sidewall 161 of the open portion 160 of the second protective layer 142 is 7 degrees or less, 6 degrees or less, or 5 degrees or less.

Preferably, a horizontal distance W2 between a first end closest to an upper surface of the second protective layer 142 and a second end closest to a lower surface of the second protective layer 142 among the sidewalls 161 of the second protective layer 142 may be 60 μm or less. For example, a horizontal distance W2 between a first end closest to an upper surface of the second protective layer 142 and a second end closest to a lower surface of the second protective layer 142 among the sidewalls 161 of the second protective layer 142 may be 50 μm or less. A horizontal distance W2 between a first end closest to an upper surface of the second protective layer 142 and a second end closest to a lower surface of the second protective layer 142 may be 45 μm or less.

Meanwhile, in an embodiment, a width (e.g., an upper width of the cavity) of a region closest to the upper surface of the second insulating layer 112 among the entire region in the thickness direction of the cavity 150 may be the same as a width of a region closest to the upper surface of the second insulating layer 112 among the entire region in the thickness direction of the open portion 160 of the second protective layer 142. Here, the same width may mean that a difference between the upper width of the cavity 150 and the lower width of the open portion 160 is 7 μm or less, 6 μm or less, 5 μm or less, or 3 μm or less.

Meanwhile, a planar area occupied by the first portion 152-1 may be 70% to 95% of an total planar area of the lower surface 152 of the cavity 150 of the embodiment. For example, a planar area occupied by the first portion 152-1 may be 72% to 92% of an total planar area of the lower surface 152 of the cavity 150. For example, a planar area occupied by the first portion 152-1 may be 75% to 90% of an total planar area of the lower surface 152 of the cavity 150.

In other words, a plane area occupied by the second portion 152-2 may be 5% to 30% of an total planar area of the lower surface 152 of the cavity 150 according to an embodiment. For example, a plane area occupied by the second portion 152-2 may be 8% to 28% of an total planar area of the lower surface 152 of the cavity 150. A plane area occupied by the second portion 152-2 may be 10% to 25% of an total planar area of the lower surface 152 of the cavity 150.

In the total planar area of the lower surface 152 of the cavity 150, if the planar area occupied by the first portion 152-1 is less than 70%, or if the planar area occupied by the second portion 152-2 exceeds 30%, the height of the lower surface 152 of the cavity 150 is not uniform, and thus the device mounting property may be deteriorated in the process of mounting the device in the cavity 150. In the total planar area of the lower surface 152 of the cavity 150, if the planar area occupied by the first portion 152-1 exceeds 95%, or if the planar area of the second portion 152-2 exceeds 5%, a part of the first insulating layer 111 may also be processed in the process of forming the cavity 150.

An embodiment forms a cavity in a circuit board using a laser beam of a top-hat distribution. Accordingly, the embodiment may reduce a roughness of a lower surface compared to a cavity formed by a laser beam of a gaussian distribution. Accordingly, an embodiment may improve the physical reliability of the cavity, thereby improving the mountability of the device.

Specifically, the lower surface of the cavity in the embodiment includes a plurality of first portions and a second portion between the plurality of first portions. In this case, the first portion is a flat portion having a substantially uniform height. In addition, the second portion is a portion protruding with a certain height between the first portions. In this case, the first portion in the embodiment may be formed flat, unlike the comparative example. For example, in a comparative example, a cavity is formed by a Gaussian-distributed laser beam, whereby the first portion of the lower surface of the cavity has a concave shape in a downward direction. Accordingly, a surface roughness in the first portion (which means that a height difference for each location of the first portion is large), and thus the reliability of the cavity may be deteriorated. Here, deteriorating the reliability of the cavity may mean that the mountability of the device mounted in the cavity is deteriorated.

On the other hand, the embodiment forms a cavity by providing a laser beam with a uniform power energy distribution using a laser beam having a top-hat distribution, so that the first portion may have a substantially flat lower surface. Accordingly, the embodiment may improve the mountability of the device mounted in the cavity, and further improve the product reliability of a circuit board.

In addition, the embodiment forms a cavity using a laser beam of a Top-hat distribution, and may omit a configuration such as a laser stop layer or a laser mask used to form the cavity. Accordingly, the embodiment can omit a process of forming and removing the stop layer and the laser mask, thereby improving product processability. Accordingly, the embodiment can lower the product price and further improve product yield.

In addition, in the embodiment, an inclination angle of the cavity may be formed close to 90 degrees without a laser mask by forming a cavity using a laser beam of a top-hat distribution. Accordingly, the embodiment may minimize a difference between an upper width and a lower width of the cavity, thereby minimizing an area of a dead region. In addition, the embodiment may improve circuit integration by minimizing the area of the dead region, and further reduce an overall volume of the circuit board.

In addition, the embodiment proceeds with a process of forming the cavity after forming the open portion in the protective layer. This may be because a cavity having an improved inclination angle may be formed without a laser mask by using a laser beam of a Top-hat distribution. Accordingly, the embodiment may allow a width of the open portion and a width of the cavity to have substantially the same width by forming the cavity after forming the open portion in the protective layer. This is due to the fact that the open portion is formed before the cavity and does not need to consider a process deviation for forming the open portion, and forms a part of the open portion in a process of forming the cavity. Accordingly, the embodiment may minimize the dead region by having substantially the same width between the open portion and the cavity, thereby improving circuit integration and reducing the volume of the circuit board.

Figure 11:
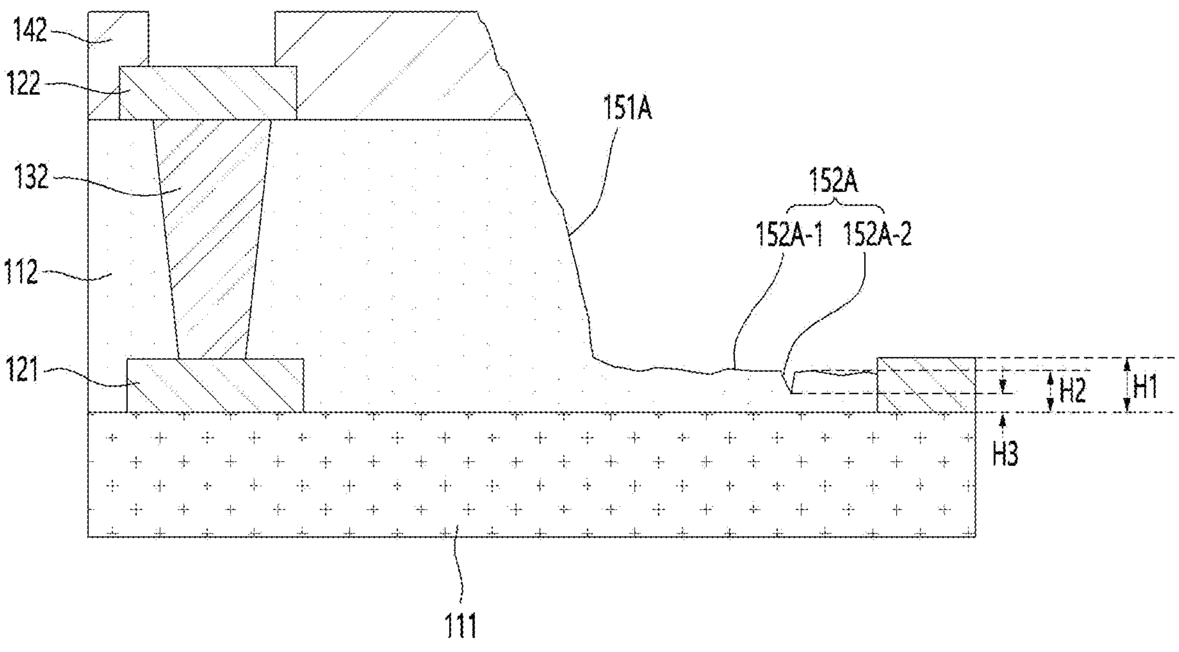
FIG. 11 is a view illustrating a modified example of the cavity of the circuit board of FIG. 3.

FIG. 11 is a diagram illustrating a modified example of the cavity of the circuit board of FIG. 3.

Referring to FIG. 11, the circuit board may change a shape of the second portion of the lower surface of the cavity by adjusting an overlapping region between a plurality of laser beams. Before explaining of FIG. 11, components having substantially the same configuration and structure as the circuit boards of FIGS. 3 and 10 will be assigned the same reference numerals.

Referring to FIG. 11, the circuit board includes a first insulating layer 111 and a second insulating layer 112.

In addition, a first circuit pattern layer 121 is disposed on the upper surface of the first insulating layer 111. The first circuit pattern layer 121 may include a pad vertically overlapping the cavity.

The second insulating layer 112 includes a cavity.

The cavity includes a sidewall 151A and a lower surface 152A. The sidewall 151A of the cavity has substantially the same structure as the sidewall 151 of the cavity 150 in the first embodiment described above, and thus a description thereof will be omitted.

The cavity includes a lower surface 152A.

The lower surface 152A is positioned higher than the upper surface of the first insulating layer 111.

The lower surface 152A includes a plurality of first portions 152A-1 and a plurality of second portions 152A-2. Each of the plurality of first portions 152A-1 may mean a substantially constant or uniform portion of height, or may mean a flat portion. For example, a height deviation (or thickness deviation) between a portion having a highest height (or highest thickness) and a portion having a lowest height (lowest thickness) in the first portion 152A-1 may mean 1 μm or less, 0.8 μm or less, or 0.5 μm or less.

Each of the plurality of second portions 152A-2 may be disposed between two adjacent first portions among the plurality of first portions 152A-1.

In this case, the second portion 152-2 of the first embodiment has a structure protruding upward with respect to the first portion 152-1.

Alternatively, the second portion 152A-2 of the second embodiment may have a structure recessed in a downward direction with respect to the first portion 152A-1.

Specifically, in a process of forming a cavity, the embodiment increases an area of the overlapping region of the first and second laser beams compared to the first embodiment, so that the second portion 152A-2 of the lower surface 152A of the cavity may be recessed in the downward direction with respect to the first portion 152A-1.

In the lower surface 152A of the cavity, a vertical distance (e.g., a depth of a second portion based on the first port) between the lowermost ends of the second portion 152A-2 in the first portion 152A-1 may satisfy a range of 1.2 μm to 5 μm. For example, in the lower surface 152A of the cavity, a vertical distance (e.g., depth of a second portion based on the first portion) between the first portion 152A-1 and a lowermost end of the second portion 152A-2 may satisfy a range of 1.4 μm to 3 μm. In the lower surface 152A of the cavity, a vertical distance (e.g., depth of a second portion based on the first portion 152A-2) between the first portion 152A-1 and a lowermost end of the second portion 152A-2 may satisfy a range of 1.5 μm to 2 μm.

In the lower surface 152A of the cavity, when the vertical distance between the lowermost end of the second portion 152A-2 and the first portion 152A-1 exceeds 5 μm, a lowermost end of the second portion 152A-2 may be positioned lower than an upper surface of the first insulating layer 111, thereby causing a reliability problem.

A height H2' of the first portion 152A-1 may satisfy a range of 10% to 80% of a height of the pad H1 of the pad 121P. The height of the first portion 152A-1 may be greater than the height H3' of the second portion 152A-2 and may satisfy a range of 12% to 70% of the height H1 of the pad. The height of the first portion 152A-1 may be greater than the height H3' of the second portion 152A-2 and may satisfy a range of 15% to 65% of the height H1 of the pad.

When the height H2' of the first portion 152A-1 is less than 10% of the height H1 of the pad 121P, the second portion 152A-2 of the lower surface 152A of the cavity 150 may be positioned lower than the upper surface of the first insulating layer 111 in the process of forming the cavity 150. When the height H2' of the first portion 152A-1 exceeds 80% of the height H1 of the pad 121P, electrical reliability and physical reliability problems may occur in the process of mounting a device in the cavity 150.

Meanwhile, the height H3' of the second portion 152A-2 may be smaller than the height H2' of the first portion 152A-1 and may satisfy a range of 5% to 70% of the height H1 of the pad. Here, the height H3' of the second portion 152A-2 may mean a height from the upper surface of the first insulating layer 111 to the lowermost end of the second portion 152A-2. For example, the height H3' of the second portion 152A-2 may be smaller than the height H2' of the first portion 152A-1 and may satisfy a range of 7% to 65% of the height H1 of the pad. For example, the height H3' of the second portion 152A-2 may be smaller than the height H2' of the first portion 152A-1 and may satisfy a range of 10% to 60% of the height H1 of the pad.

When the height H3' of the second portion 152A-2 is less than 5% of the height H1 of the pad, the lowermost end of the second portion 152A-2 may be located lower than the upper surface of the first insulating layer 111 due to process deviation in the process of forming the cavity.

When the height H3' of the second portion 152A-2 is greater than 70% of the height H1 of the pad, there may be a problem that the first portion 152A-2 of the lower surface 152A is located higher than the pad.

The second portion of the lower surface of the cavity can have a protruding protrusion shape, or a recessed recess shape by adjusting the area of the overlapping region of the laser beam in the cavity formation process.

On the other hand, the embodiment is not limited thereto, and the lower surface of the cavity may include only the first portion except for the second portion by adjusting the area of the overlapping region of the laser beam.

Figure 12:
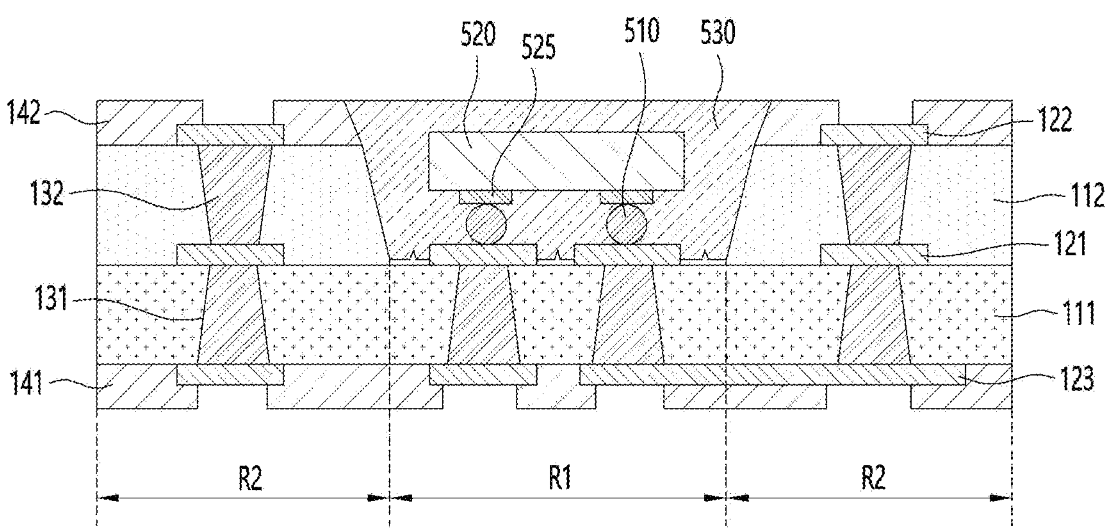
FIG. 12 is a view illustrating a semiconductor package according to an embodiment.

FIG. 12 is a view illustrating a semiconductor package according to an embodiment.

Referring to FIG. 12, the semiconductor package according to an embodiment includes a device 520 mounted in the cavity 150 illustrated in FIG. 3.

That is, the circuit board described above may be used as a package substrate for mounting the device 520 such as a chip.

As described above, the circuit board includes a cavity 150, and the first pad 121P of the first circuit pattern layer 121 may be disposed in the cavity 150.

A connection part 510 may be disposed on the first pad 121P.

In this case, a planar shape of the connection part 510 may be circular. The connection part 510 may be disposed on the first pad 121P to electrically connect the device 520 to the first pad 121P while fixing the device 520. To this end, the connection part 510 may include a conductive material. For example, the connection part 510 may be a solder ball, but is not limited thereto.

The connection part 510 may include a solder and a heterogeneous material. The solder may be composed of at least one of Sn—Cu, Sn—Pb, and Sn—Ag—Cu. and, the heterogeneous material may include any one of Al, Sb, Bi, Cu, Ni, In, Pb, Ag, Sn, Zn, Ga, Cd, and Fe.

An electronic device 520 may be mounted on the connection part 510.

In this case, the electronic device 520 may be an electronic component disposed in the cavity 150 of the circuit board, which may be divided into an active device and a passive device. And, the active device is a device that actively uses the nonlinear part, and the passive device means a device that does not use the nonlinear characteristics even though both the linear and the nonlinear characteristics exist. In addition, the passive device may include a transistor, an IC semiconductor chip, and the passive device may include a capacitor, a resistor, an inductor, and the like. The passive device is mounted on a conventional circuit board in order to increase a signal processing speed of a semiconductor chip, which is an active device, or to perform a filtering function.

In this case, the device 520 may include a terminal 525 on a lower surface thereof. In addition, the terminal 525 of the device 520 may be electrically connected to the first pad 121P through the connection part 510.

Also, a molding layer 530 may be disposed in the cavity 150. The molding layer 530 may be disposed while molding the device 520 in the cavity 150. The molding layer 530 may protect the device 520 and inhibit foreign substances from penetrating into the cavity 150.

The molding layer 530 may be formed of a molding resin, and may be, for example, an epoxy molding compound (EMC). However, the embodiment is not limited thereto, and the molding layer 530 may be composed of various other molding resins other than EMC.

Hereinafter, a method of manufacturing a circuit board according to an embodiment will be described with reference to the accompanying drawings.

FIGS. 13 to 17 are views illustrating a method of manufacturing a circuit board according to an embodiment in order of processes.

Before explaining the method of manufacturing the circuit board of the present application, a circuit board may have three or more layers based on an insulating layer. Also, the circuit board may include a core layer. However, hereinafter, for convenience of explanation, it will be described that the circuit board is a coreless substrate and includes two layers of insulating layers. Also, the circuit board includes a cavity, and the cavity may be formed by opening at least one insulating layer. In this case, the cavity may be formed by opening two or more insulating layers, but hereinafter, a process in which only one layer of insulating layers is opened will be described.

In addition, the circuit board of the embodiment may have an Embedded Trace Substrate (ETS) structure.

Figure 13:
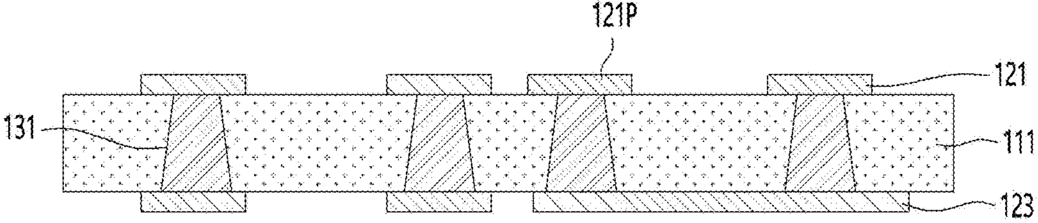
FIGS. 13 to 17 are views illustrating a method of manufacturing a circuit board according to an embodiment in order of processes.

Referring to FIG. 13, an embodiment prepares a first insulating layer 111.

Further, the embodiment may perform a process of forming a first through electrode 131, a first circuit pattern layer 121, and a third circuit pattern layer 123 respectively on the first insulating layer 111. For example, the embodiment may form a through hole (not shown) passing through the first insulating layer 111. Further, an embodiment may perform a process of forming a first metal layer, which is a seed layer, on an upper surface, a lower surface of the first insulating layer 111, and on each sidewall of the through hole. Next, the embodiment may perform electroplating on the first metal layer to form the second metal layer. Further, the first metal layer and the second metal layer may constitute a first circuit pattern layer 121, a third circuit pattern layer 123, and a first through electrode 131, respectively.

In this case, the first circuit pattern layer 121 of the embodiment does not include a stop layer capable of controlling a depth of the cavity to form the cavity. That is, the embodiment is configured to form the cavity 150 using a laser beam of a top-hat distribution. Accordingly, the embodiment may form the cavity 150 having a uniform height while having a constant depth without the stop layer.

Figure 14:
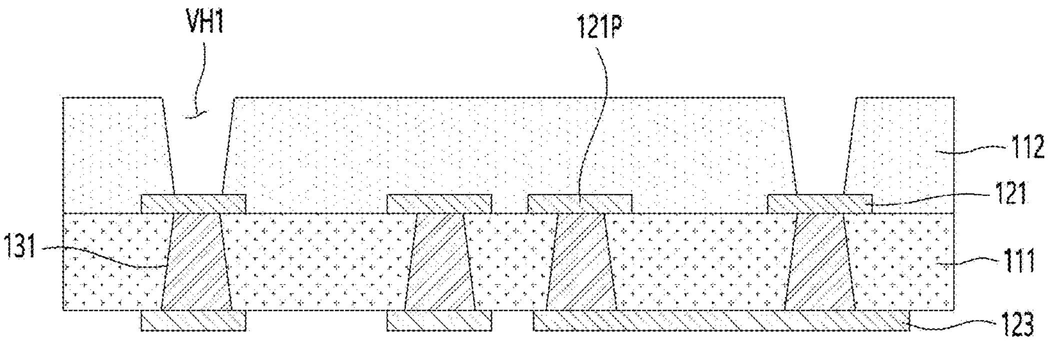

Next, referring to FIG. 14, in an embodiment, the second insulating layer 112 is formed on the first insulating layer 111.

In addition, the embodiment forms a through hole VH1 in the second insulating layer 112. The through hole VH1 may vertically overlap at least a portion of the first circuit pattern layer 121 disposed on the upper surface of the first insulating layer 111.

Figure 15:
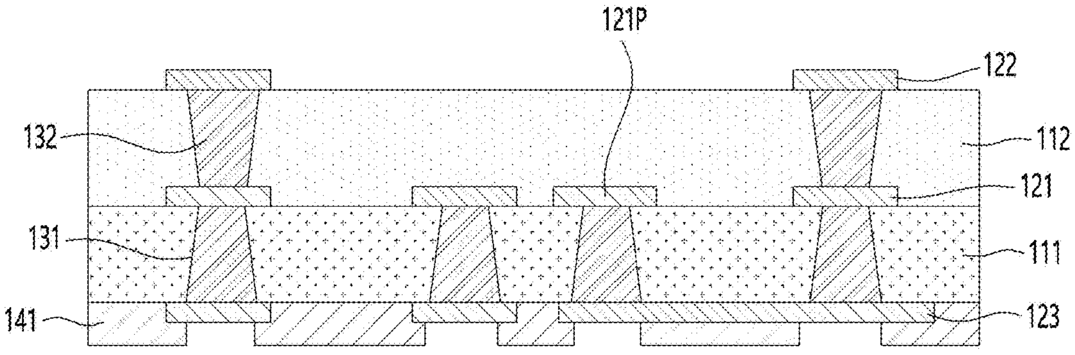

Next, referring to FIG. 15, the embodiment may proceed with a process of forming a second through electrode 132 and a second circuit pattern layer 122 filling the through hole VH1 of the second insulating layer 112.

Figure 16:
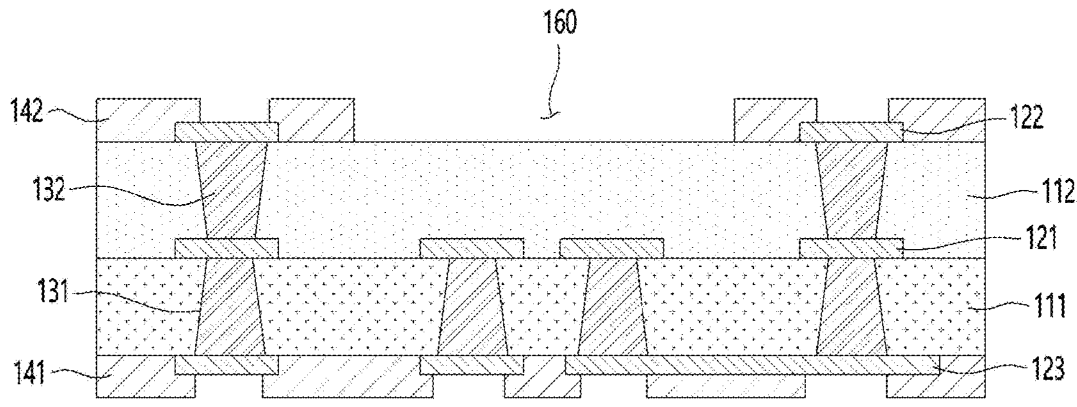

Next, referring to FIG. 16, the embodiment may proceed with a process of forming a first protective layer 141 on a lower surface of the first insulating layer 111 and forming a second protective layer 142 on an upper surface of the second insulating layer 112. Thereafter, the embodiment may proceed with a process of forming openings in the first protective layer 141 and the second protective layer 142. The openings vertically overlap the second circuit pattern layer 122 and the third circuit pattern layer 123, thereby exposing surfaces of the second circuit pattern layer 122 and the third circuit pattern layer 123.

In addition, the embodiment may perform a process of forming an opening 160 in the second protective layer 142 in the process of forming the opening. The opening 160 may vertically overlap a region in which the cavity 150 is to be formed in the second insulating layer 112. That is, the embodiment performs a process of forming the opening 160 of the second protective layer 142 and the second protective layer 142 before forming the cavity 150 as described above. Accordingly, the embodiment may improve circuit integration by making a width of the opening 160 of the second protective layer 142 substantially equal to a width of the cavity 150.

Figure 17:
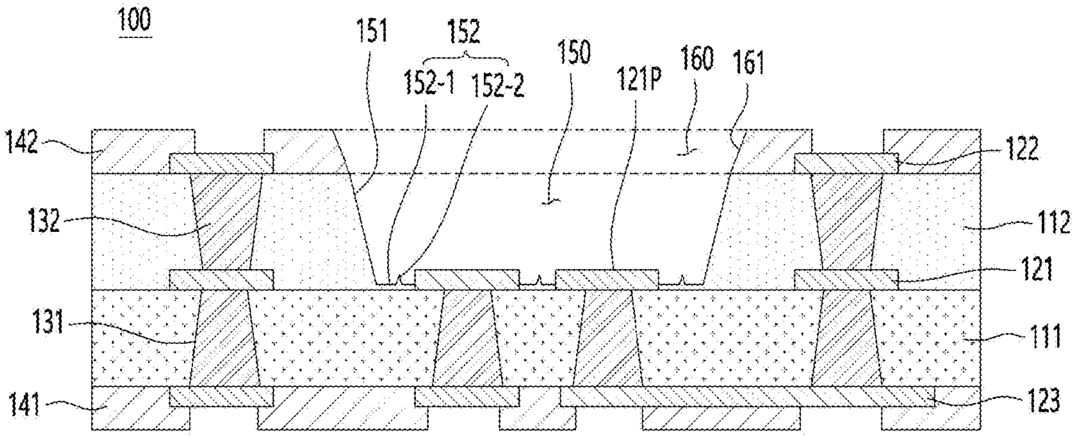

Next, referring to FIG. 17, the embodiment may proceed with a process of forming the cavity 150 in the second insulating layer 112 by using the laser device shown in FIG. 7. In this case, the laser device may irradiate a laser beam having a top-hat distribution onto the second insulating layer 112. In addition, at least a portion of the laser beam is also provided on the sidewall 161 of the open portion 160 of the second protective layer 142, so that the sidewall of the open portion 160 may have an inclination angle corresponding to the sidewall 151 of the cavity 150.

Accordingly, in an embodiment, the cavity 150 is formed by the laser beam of the top-hat distribution. Accordingly, the lower surface 152 of the cavity 150 includes a first portion 152-1 and a second portion 152-2. In addition, the first portion 152-1 may be a flat portion having a substantially uniform height. And, the second portion 152-2 may be a portion protruding from between a plurality of first portions 152-1 with a predetermined height.

An embodiment forms a cavity in a circuit board using a laser beam of a top-hat distribution. Accordingly, the embodiment may reduce a roughness of a lower surface compared to a cavity formed by a laser beam of a gaussian distribution. Accordingly, an embodiment may improve the physical reliability of the cavity, thereby improving the mountability of the device.

Specifically, the lower surface of the cavity in the embodiment includes a plurality of first portions and a second portion between the plurality of first portions. In this case, the first portion is a flat portion having a substantially uniform height. In addition, the second portion is a portion protruding with a certain height between the first portions. In this case, the first portion in the embodiment may be formed flat, unlike the comparative example. For example, in a comparative example, a cavity is formed by a Gaussian-distributed laser beam, whereby the first portion of the lower surface of the cavity has a concave shape in a downward direction. Accordingly, a surface roughness in the first portion (which means that a height difference for each location of the first portion is large), and thus the reliability of the cavity may be deteriorated. Here, deteriorating the reliability of the cavity may mean that the mountability of the device mounted in the cavity is deteriorated.

On the other hand, the embodiment forms a cavity by providing a laser beam with a uniform power energy distribution using a laser beam having a top-hat distribution, so that the first portion may have a substantially flat lower surface. Accordingly, the embodiment may improve the mountability of the device mounted in the cavity, and further improve the product reliability of a circuit board.

In addition, the embodiment forms a cavity using a laser beam of a Top-hat distribution, and may omit a configuration such as a laser stop layer or a laser mask used to form the cavity. Accordingly, the embodiment can omit a process of forming and removing the stop layer and the laser mask, thereby improving product processability. Accordingly, the embodiment can lower the product price and further improve product yield.

In addition, in the embodiment, an inclination angle of the cavity may be formed close to 90 degrees without a laser mask by forming a cavity using a laser beam of a top-hat distribution. Accordingly, the embodiment may minimize a difference between an upper width and a lower width of the cavity, thereby minimizing an area of a dead region. In addition, the embodiment may improve circuit integration by minimizing the area of the dead region, and further reduce an overall volume of the circuit board.

In addition, the embodiment proceeds with a process of forming the cavity after forming the open portion in the protective layer. This may be because a cavity having an improved inclination angle may be formed without a laser mask by using a laser beam of a Top-hat distribution. Accordingly, the embodiment may allow a width of the open portion and a width of the cavity to have substantially the same width by forming the cavity after forming the open portion in the protective layer. This is due to the fact that the open portion is formed before the cavity and does not need to consider a process deviation for forming the open portion, and forms a part of the open portion in a process of forming the cavity. Accordingly, the embodiment may minimize the dead region by having substantially the same width between the open portion and the cavity, thereby improving circuit integration and reducing the volume of the circuit board.

On the other hand, when the circuit board having the above-described characteristics of the invention is used in an IT device or home appliance such as a smart phone, a server computer, a TV, and the like, functions such as signal transmission or power supply can be stably performed. For example, when the circuit board having the features of the present invention performs a semiconductor package function, it can function to safely protect the semiconductor chip from external moisture or contaminants, or alternatively, it is possible to solve problems of leakage current, electrical short circuit between terminals, and electrical opening of terminals supplied to the semiconductor chip. In addition, when the function of signal transmission is in charge, it is possible to solve the noise problem. Through this, the circuit board having the above-described characteristics of the invention can maintain the stable function of the IT device or home appliance, so that the entire product and the circuit board to which the present invention is applied can achieve functional unity or technical interlocking with each other.

When the circuit board having the characteristics of the invention described above is used in a transport device such as a vehicle, it is possible to solve the problem of distortion of a signal transmitted to the transport device, or alternatively, the safety of the transport device can be further improved by safely protecting the semiconductor chip that controls the transport device from the outside and solving the problem of leakage current or electrical short between terminals or the electrical opening of the terminal supplied to the semiconductor chip. Accordingly, the transportation device and the circuit board to which the present invention is applied can achieve functional integrity or technical interlocking with each other.

Features, structures, effects, etc. described in the above embodiments are included in at least one embodiment, and it is not necessarily limited to only one embodiment. Furthermore, features, structures, effects, etc. illustrated in each embodiment can be combined or modified for other embodiments by those of ordinary skill in the art to which the embodiments belong. Accordingly, the contents related to such combinations and variations should be interpreted as being included in the scope of the embodiments.

In the above, the embodiment has been mainly described, but this is only an example and does not limit the embodiment, and those of ordinary skill in the art to which the embodiment pertains will appreciate that various modifications and applications not illustrated above are possible without departing from the essential characteristics of the present embodiment. For example, each component specifically shown in the embodiment can be implemented by modification. And the differences related to these modifications and applications should be interpreted as being included in the scope of the embodiments set forth in the appended claims.

The invention claimed is:

1. A circuit board comprising:

a first insulating layer;

a second insulating layer disposed on the first insulating layer and including a cavity; and a circuit pattern layer disposed between the first insulating layer and the second insulating layer;

wherein the circuit pattern layer includes a pad overlapping the cavity along a vertical direction, wherein a lower surface of the cavity includes a first portion and a second portion having steps from each other, and wherein an uppermost end of each of the first portion and the second portion is positioned lower than an upper surface of the pad.

2. The circuit board of claim 1, wherein the first portion has a curvature, and wherein a height difference between the uppermost end and a lowermost end of the first portion is 1 μm or less.

3. The circuit board of claim 1, wherein the second portion is a protruding surface protruding toward an upper surface of the second insulating layer with respect to the first portion.

4. The circuit board of claim 1, wherein an edge of the first portion has a square shape.

5. The circuit board of claim 4, wherein the second portion is provided along the edge of the first portion.

6. The circuit board of claim 1, wherein a height of the first portion of the lower surface of the cavity satisfies a range of 5% to 70% of a height of the pad.

7. The circuit board of claim 1, wherein a height of the second portion of the lower surface of the cavity satisfies a range of 10% to 80% of a height of the pad.

8. The circuit board of claim 1, wherein a height of the second portion of the lower surface of the cavity satisfies a range of 1.2 μm to 5 μm.

9. The circuit board of claim 1, wherein the second portion is a concave surface concave toward a lower surface of the first insulating layer with respect to the first portion.

10. The circuit board of claim 1, wherein an inclination angle between the first portion and a side wall of the cavity satisfies a range of 91 degrees to 110 degrees.

11. The circuit board of claim 9, wherein the second portion is positioned higher than an upper surface of the first insulating layer.

12. The circuit board of claim 1, wherein a sidewall of the cavity has a curvature.

13. The circuit board of claim 1, wherein the sidewall of the cavity includes a first end closest to an upper surface of the second insulating layer, and a second end overlapping the pad along a horizontal direction, and wherein a horizontal distance between the first end of the cavity and the second end of the cavity in the horizontal direction satisfies a range of 5 μm to 60 μm.

14. The circuit board of claim 1, wherein the first portion has a plane area in a range of 70% to 95% of a total plane area of the lower surface of the cavity, and wherein the second portion has a plane area in a range of 5% to 30% of the total plane area of the lower surface of the cavity.

15. The circuit board of claim 1, wherein a lower surface of the cavity has a waffle shape.

16. The circuit board of claim 1, comprising:

a protective layer disposed on the second insulating layer and including a through hole overlapping the cavity in the vertical direction.

17. The circuit board of claim 16, wherein a width of the through hole of the protective layer in a region closest to the cavity corresponds to a width of the cavity in a region closest to the through hole.

18. The circuit board of claim 16, wherein a sidewall of the through hole of the protective layer has a curvature; and wherein an inclination angle of the sidewall of the through hole of the protective layer corresponds to an inclination angle of a sidewall of the cavity.

19. The circuit board of claim 16, wherein a sidewall of the through hole includes an upper end of the through hole closest to an upper surface of the protective layer at one side of the through hole and a lower end of the through hole closest to a lower surface of the protective layer at the one side of the through hole, and wherein a horizontal distance between the upper end and the lower end satisfies a range of 5 μm to 60 μm.

20. The circuit board of claim 1, comprising:

an electronic device disposed in the cavity.

* * * * *